(12) United States Patent
Horng et al.

(10) Patent No.: US 12,132,081 B2
(45) Date of Patent: Oct. 29, 2024

(54) TRANSISTOR CELLS FOR LONGER CHANNEL TRANSISTORS

(71) Applicant: Taiwan Semiconductor Manufacturing Company, Ltd., Hsinchu (TW)

(72) Inventors: Jaw-Juinn Horng, Hsinchu (TW); Yi-Wen Chen, Hsinchu (TW); Chin-Ho Chang, Hsinchu (TW); Po-Yu Lai, Taipei (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 300 days.

(21) Appl. No.: 17/545,825

(22) Filed: Dec. 8, 2021

(65) Prior Publication Data

US 2023/0178605 A1    Jun. 8, 2023

(51) Int. Cl.
   *H01L 29/06*    (2006.01)
   *H01L 27/088*   (2006.01)
   *H01L 29/40*    (2006.01)

(52) U.S. Cl.
   CPC ........ *H01L 29/0696* (2013.01); *H01L 27/088* (2013.01); *H01L 29/401* (2013.01)

(58) Field of Classification Search
   None
   See application file for complete search history.

(56) References Cited

U.S. PATENT DOCUMENTS

| | | | |
|---|---|---|---|
| 9,947,389 B1* | 4/2018 | Hsu | G11C 11/418 |
| 2016/0284388 A1* | 9/2016 | Hsu | G11C 29/50016 |
| 2018/0046744 A1* | 2/2018 | Lin | G06F 30/394 |

* cited by examiner

*Primary Examiner* — William C Trapanese
(74) *Attorney, Agent, or Firm* — MERCHANT & GOULD P.C.

(57) ABSTRACT

A device including at least one transistor cell including metal-oxide semiconductor field-effect transistors each having drain/source terminals and a channel length. The at least one transistor cell includes a first number of transistors of the metal-oxide semiconductor field-effect transistors connected in series, with one of the drain/source terminals of one of the first number of transistors connected to one of the drain/source terminals of another one of the first number of transistors and gates of the first number of transistors connected together. The at least one transistor cell configured to be used to provide a transistor having a longer channel length than the channel length of each of the metal-oxide semiconductor field-effect transistors.

20 Claims, 27 Drawing Sheets

| Mismatch | N 3<br>Lg=3n | N 4<br>Lg=3n | N 5<br>Lg=3n | N 2<br>Lg=22n |
|---|---|---|---|---|
| L=55nm @10uA, Vds=0.35<br>Psvt: 9.7%<br>Nsvt: 12% | Psvt: 17.4%<br>Nsvt: 18.7% | Psvt: 13.5%<br>Nsvt: 14.6% | Psvt: <7.1%<br>Nsvt: <9.2% | Psvt: 9.9%<br>Nsvt: NA |
| L=55nm @10uA, Vds=0.05<br>Psvt: 9.7%<br>Nsvt: 7% | Psvt: 7.5%<br>Nsvt: 9.9% | Psvt: 4.5%<br>Nsvt: 6.2% | | Psvt: 13.3%<br>Nsvt: NA% |
| L=55nm @5uA, Vds=0.35<br>Psvt: 12.1%<br>Nsvt: 15% | Psvt: 22.2%<br>Nsvt: 23.4%<br>Area: 1x | Psvt: 17.6%<br>Nsvt: 18.9% | Psvt: 7.1%<br>Nsvt: 9.2% | Psvt: 13.3%<br>Nsvt: NA |
| L=55nm @5uA, Vds=0.05<br>Psvt: 14.9%<br>Nsvt: 10% | Psvt: 22.6%<br>Nsvt: 17.5% | Psvt: 9.8%<br>Nsvt: 12.4% | | Psvt: 17.4%<br>Nsvt: NA |

FIG. 3

| PMOS current mirror Psvt, L=55nm | Original plan N 1 Lg=3n | N 3 Lg=3n | N 4 Lg=3n | N 2 Lg=22n | N 3 Lg=22n |
|---|---|---|---|---|---|
| Stages=26 C=36 Gate=936 | Stages=84 C=54 Gate=4536 | Stages=26x3 C=36 Gate=2808 | Stages=26x4 C=36 Gate=3744 | Stages=26x2 C=36 Gate=1872 | Stages=26x3 C=36 Gate=2808 |
| Mismatch 1-sigma 0.3% | 0.3% | 0.3% | 0.25% | 0.25% | 0.16% |
| Size X 1.0 | X1.1 | X0.68 | X0.9 | X1.03 | X1.26 |

| Gate Number Shrinkage (Parallel, V-stage cell) | N=3 | N=4 | N=5 | N=6 |
|---|---|---|---|---|
| P=1, C=2 | 6,4=67% | 8,5=62.5% | 10,6=60% | 12,7=58.3% |
| P=1, C=3 | 9,5=55.6% | 12,6=50% | 15,7=46.7% | 18,8=44.4% |
| P=1, C=4 | 12,6=50% | 16,7=43.8% | 20,8=40% | 24,9=37.5% |
| P=1, C=5 | 15,7=46.7% | 20,8=40% | 25,9=36% | 30,10=33.3% |
| P=1, C=6 | 18,8=44.4% | 24,9=37.5% | 30,10=33.3% | 36,11=30.6% |

FIG. 8

| Parallel stacked gate cell 10uA@Vds=0.05 | V stacked gate cell N=3, P=1 | V stacked gate cell N=4, P=1 | V stacked gate cell N=5, P=1 |
|---|---|---|---|
| N=3, C=2, Psvt: 10.2%'Nsvt: 12.4%<br>N=4, C=2, Psvt: 6.9%'Nsvt: 8.9%<br>N=5, C=2, Psvt: 5.2%'Nsvt: 6.5% | Psvt: 9%<br>Nsvt: 11.4% | Psvt: 5.2%<br>Nsvt: 7.2% | Psvt: 3.5%<br>Nsvt: 4.7% |
| N=3, C=3, Psvt: 10.4%'Nsvt: 12.9%<br>N=4, C=3, Psvt: 7.6%'Nsvt: 9.4%<br>N=5, C=3, Psvt: 6.4%'Nsvt: 6.5% | Psvt: 9.8%<br>Nsvt: 12.9% | Psvt: 5.8%<br>Nsvt: 7.0% | Psvt: 3.7%<br>Nsvt: 5.1% |
| N=3, C=4, Psvt: 10.5%'Nsvt: 12.1%<br>N=4, C=4, Psvt: 7.6%'Nsvt: 9.4%<br>N=5, C=4, Psvt: 6.8%'Nsvt: 7.8% | Psvt: 10.6%<br>Nsvt: 13.7% | Psvt: 6%<br>Nsvt: 8% | Psvt: 3.9%<br>Nsvt: 5.5% |

FIG. 9

TRANSISTOR CELLS FOR LONGER CHANNEL TRANSISTORS

BACKGROUND

Typically, each generation of a semiconductor manufacturing process is referred to as a technology node or process node that has its own rules on the minimum size and spacing of features in a semiconductor chip. Often, a newer process node has smaller minimum sizes and tighter spacing that allows a semiconductor die to be made smaller or shrunk, reducing the cost of the die and improving the performance of the die based, at least in part, on an increase in transistor density. Sometimes, a newer or advanced process node does not provide transistors available at previous process nodes. The advanced process node may not offer higher voltage devices, such as higher voltage input/output (I/O) devices, available at the previous process nodes since thicker oxide is difficult to implement in smaller devices. Also, the advanced process node may not offer longer channel devices available at previous process nodes, where the longer channel devices provide higher drain-to-source resistance Rds and improved current mismatch performance in circuits such as current mirrors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 3 is a diagram schematically illustrating the current mismatch performance of a current mirror designed with transistors having larger channel lengths from an earlier process node and transistors having smaller channel lengths from a newer process node, in accordance with some embodiments.

FIG. 5 is a diagram schematically illustrating current mismatch performance and size of a multi-stage stacked gate cell from an earlier or previous process node and equivalent long channel devices from a newer process node, in accordance with some embodiments.

FIG. 8 is a diagram schematically illustrating reductions in the number of gates or transistors in a V stacked gate cell as compared to a parallel stacked gate cell, in accordance with some embodiments.

FIG. 9 is a diagram schematically illustrating the current mismatch performance of a current mirror designed with parallel stacked gate cells and with V stacked gate cells, in accordance with some embodiments.

DETAILED DESCRIPTION

Figure 1:
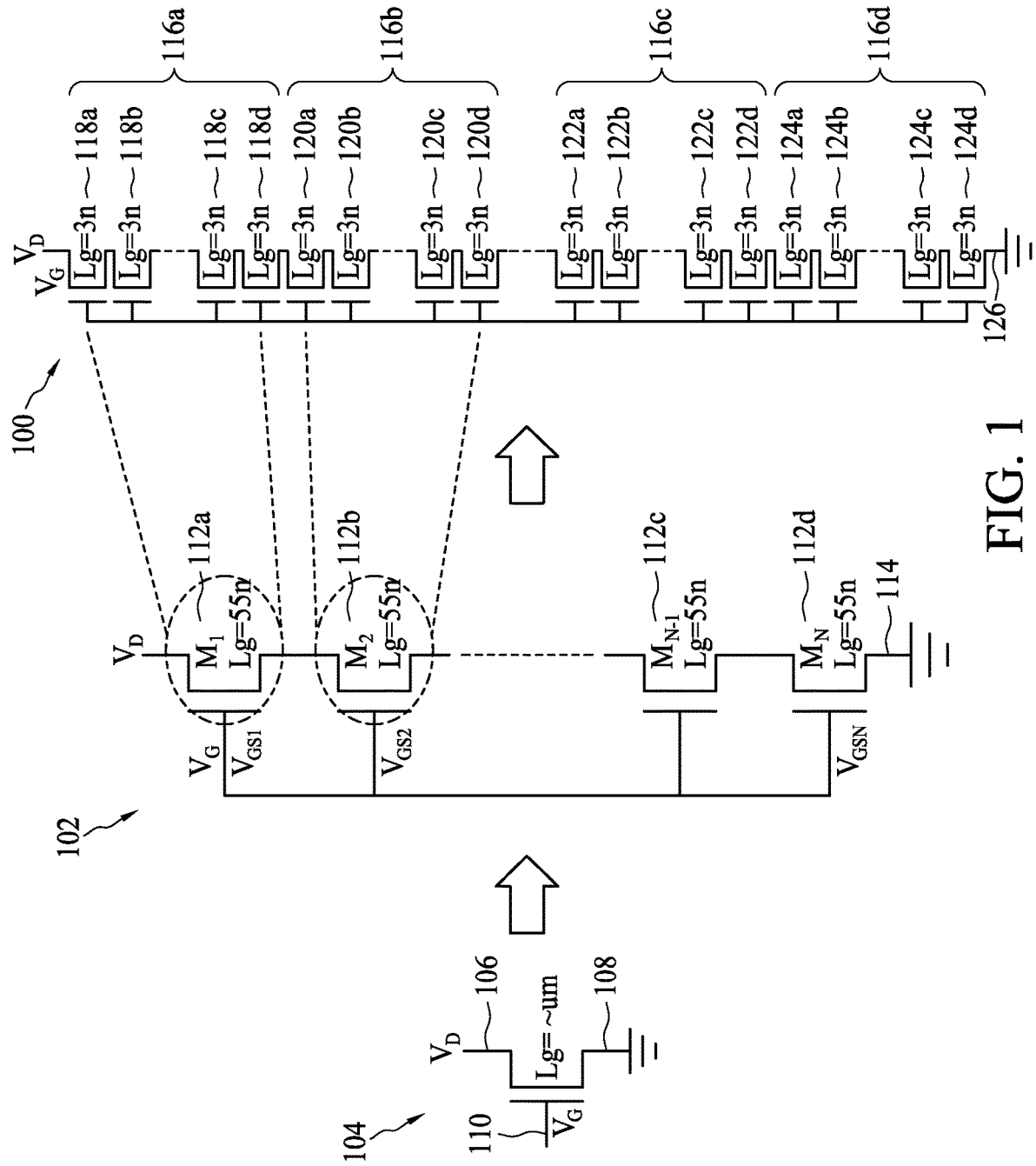
FIG. 1 is a diagram schematically illustrating multi-stage stacked gate cells configured for replacing a longer channel length transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As disclosed herein, a newer or advanced process node may include transistors arranged in multiple stage (multi-stage) stacked devices. These stacked devices can be used to replace higher voltage devices and longer channel devices of previous process nodes. However, designing stacked devices at the newer process node depends on new transistor models for determining the number of stages in the multi-stage stacked devices for meeting design criteria, such as drain-to-source resistance Rds. If the new transistor models are in flux or not available, it is difficult to design the circuits and directly assess the die shrinkage ratio for the new process node. Also, since the higher voltage devices and the longer channel devices of the previous process nodes are not available at the newer process node, it is difficult to directly port a database from a previous process node to the newer process node.

To solve these problems, embodiments of this disclosure are directed to transistor cells for the newer process node, which can be used to replace devices of the previous process nodes. In some embodiments, the transistor cells include transistors having a uniform channel length organized into multi-stage stacked gate configurations. In some embodiments, the transistor cells include transistors having a minimum channel length of the new process node. In some embodiments, the transistor cells include transistors having mixed channel lengths organized into multi-stage stacked gate configurations.

The transistor cells can be used to replace the higher voltage devices and the longer channel length devices of the previous process nodes, which makes it easier to monitor replacement of the devices. In some embodiments, replacing the higher voltage devices and the longer channel length devices with the transistor cells results in die shrinkage of greater than 50%. Also, in some embodiments, the transistor cells can be treated as new higher voltage devices and new longer channel length devices in a macro model for modeling circuit designs and by design tools for porting a database from a previous process node to the newer process node.

The transistor cells can be used in a design flow that includes automatic porting and/or automatic generation tools, such that the design flow uses the transistor cells in porting a database from a previous process node to the newer process node with less new device definition and/or less updating of the design flow. In some embodiments, the design flow includes using the transistor cells to create the higher voltage devices and the longer channel devices of a previous process node with less new device definition and/or less updating of the design flow.

The transistor cells can be incorporated into the design tools. In some embodiments, a process design kit includes a kit cell of at least one of the transistor cells. In some embodiments, a macro model is configured to model at least one of the transistor cells. In some embodiments, the macro model includes at least one of a layout pattern, a layout versus schematic, and design rule checking based on at least one of the transistor cells.

Disclosed embodiments are directed to a device including transistor cells including metal-oxide semiconductor field-effect transistors (mosfets). Each of the transistor cells includes a first number of transistors connected in series, with the drain/source of one of the first number of transistors connected to the drain/source of another one of the first number of transistors and the gates of the first number of transistors connected together. Also, in some embodiments, each of the transistor cells is configured to be used to provide a transistor having a longer channel length than the channel length of each of the mosfets. In addition, in some embodiments, at least two of the transistor cells have drain/source paths connected in series and, in some embodiments, at least two of the transistor cells have drain/source paths connected in parallel.

Disclosed embodiments further include V stacked gate configurations that use fewer transistors. The V stacked gate configurations include transistors connected in series and transistors connected in parallel. In some embodiments, each of the transistor cells includes a first number of transistors connected in series, with the drain/source of one of the first number of transistors connected to the drain/source of another one of the first number of transistors and the gates of the first number of transistors connected together, and each of the transistor cells includes a second number of transistors connected in parallel, with a first drain/source of one of the second number of transistors connected to a first drain/source of another one of the second number of transistors, and a second drain/source of the one of the second number of transistors connected to a second drain/source of the other one of the second number of transistors.

The disclosed transistor cells make it easier for a design team to define a target device at the new process node. In addition, the transistor cells improve portability of a circuit design from a previous process node to the new process node. In some embodiments, replacing the higher voltage devices and the longer channel length devices of the previous process node with the transistor cells results in die shrinkage that is greater than 50%. Also, in some embodiments, the V stack gate architecture uses fewer transistors and has smaller parasitic capacitance values, resulting in speed improvements of greater than 10%.

FIG. 1 is a diagram schematically illustrating multi-stage stacked gate cells 100 and 102 configured for replacing a longer channel length transistor 104, in accordance with some embodiments. Each of the multi-gate stacked gate cells 100 and 102 is configured to replace the longer channel length transistor 104, and the multi-gate stacked gate cell 100 is configured to replace the multi-gate stacked gate cell 102. In some embodiments, the multi-stage stacked gate cell 100 is from a newer process node A, the multi-stage stacked gate cell 102 is from an earlier process node B, and the longer channel length transistor 104 is from the earliest process node C.

The longer channel length transistor 104 is an n-channel mosfet (NMOS) transistor including a drain/source 106 connected to receive the voltage VD, a source/drain 108 connected to a reference, such as ground, and a gate 110 connected to receive the gate voltage VG. In some embodiments, the longer channel length transistor 104 has a channel length of 1 or more micrometers (um). In some embodiments, the longer channel length transistor 104 is a p-channel mosfet (PMOS) transistor.

The multi-stage stacked gate cell 102 includes N stages of transistors 112a-112d connected in series with one drain/source of transistor 112a connected to receive the voltage VD and the other drain/source of transistor 112a connected to one drain/source of transistor 112b. The other drain/source of transistor 112b is connected to the drain/source of the next transistor and so on, down to the drain/source of transistor 112d connected to a reference 114, such as ground. The drain/source paths of the transistors 112a-112d are connected in series from the voltage VD to the reference 114. Throughout this disclosure a drain/source, also referred to herein as a drain/source region, is one of the drain terminal and the source terminal of a mosfet. In some embodiments, the drain/source connections can be switched for at least one of the transistors 112a-112d.

The gates of the transistors 112a-112d are connected to gate voltage VG, where transistor 112a has a gate-to-source voltage VGS1, transistor 112b has a gate-to-source voltage VGS2, and transistor 112d has a gate-to-source voltage VGSN. The transistor 112a is biased into the saturation region and each of the transistors 112b-112d is biased into the linear region. Also, each of the transistors 112a-112d is an NMOS transistor. In other embodiments, one or more of the transistors 112a-112d is a PMOS transistor.

In some embodiments, the channel length of each of the transistors 112a-112d is a minimum channel length of the process node B. In some embodiments, each of the transistors 112a-112d has the same channel length or a uniform channel length. In some embodiments, each of the transistors 112a-112d has a channel length of 55 nanometers (nm). In some embodiments, at least one of the transistors 112a-112d has a different channel length, such that the channel lengths of the transistors 112a-112d are mixed channel lengths.

The multi-stage stacked gate cell 102 is configured to provide an equivalent channel length that is equal to the channel length of longer channel length transistor 104, such that the multi-gate stacked gate 102 can be used to replace the longer channel length transistor 104. The multi-stage stacked gate cell 102 provides an equivalent longer channel that can be used to provide higher drain-to-source resistance Rds and improved current mismatch performance in circuits such as current mirrors.

The multi-stage stacked gate cell 100 includes N transistor cells 116a-116d, where each of the transistor cells 116a-116d is a replacement for a corresponding one of the N transistors 112a-112d in the multi-stage stacked gate 102. Also, each of the transistor cells 116a-116d has the same number of transistors as the other transistor cells 116a-116d.

The transistor cell 116a is a replacement for the transistor 112a and includes transistors 118a-118d. The transistor cell 116b is a replacement for the transistor 112b and includes transistors 120a-120d, and so on, down to the transistor cell 116c is a replacement for the transistor 112c and includes transistors 122a-122d, and the transistor cell 116d is a replacement for the transistor 112d and includes transistors 124a-124d. Each of the transistors 118a-118d, 120a-120d, 122a-122d, and 124a-124d is an NMOS transistor. In other embodiments, one or more of the transistors 118a-118d, 120a-120d, 122a-122d, and 124a-124d is a PMOS transistor and, in other embodiments, the transistors 118a-118d, 120a-120d, 122a-122d, and 124a-124d are a mixture of NMOS and PMOS transistors.

The transistor cell 116a includes transistors 118a-118d connected in series with one drain/source of transistor 118a connected to receive the voltage VD and the other drain/source of transistor 118a connected to one drain/source of transistor 118b. The other drain/source of transistor 118b is connected to one drain/source of the next transistor and so on, down to the drain/source of transistor 118d being connected to the drain/source of transistor 120a in transistor cell 116b. The drain/source paths of the transistors 118a-118d are connected in series from the voltage VD to the drain/source of transistor 120a. The gates of the transistors 118a-118d are connected to gate voltage VG. In this configuration, the transistor 118a is biased into the saturation region and each of the transistors 118b-118d is biased into the linear region. In some embodiments, the drain/source connections can be switched for at least one of the transistors 118a-118d.

The transistor cell 116b includes transistors 120a-120d connected in series with one drain/source of transistor 120a connected to the drain/source of transistor 118d and the other drain/source of transistor 120a connected to one drain/source of transistor 120b. The other drain/source of transistor 120b is connected to one drain/source of the next transistor and so on, down to the drain/source of transistor 120d connected to the drain/source of the next transistor in the next transistor cell. The drain/source paths of the transistors 120a-120d are connected in series from the drain/source of transistor 120a to the drain/source of the next transistor in the next transistor cell. Also, the gates of the transistors 120a-120d are connected to gate voltage VG, and the transistors 120a-120d are all biased into the linear region. In some embodiments, the drain/source connections can be switched for at least one of the transistors 120a-120d.

This continues down to the transistor cells 116c and 116d, where the transistor 116c includes transistors 122a-122d connected in series with one drain/source of transistor 122a connected to the drain/source of the transistor in the previous transistor cell and the other drain/source of transistor 122a connected to the drain/source of transistor 122b. The other drain/source of transistor 122b is connected to the drain/source of the next transistor and so on, down to the drain/source of transistor 122d connected to the drain/source of transistor 124a in transistor cell 116d. The drain/source paths of the transistors 122a-122d are connected in series from the drain/source of transistor 122a to the drain/source of transistor 124a. Also, the gates of the transistors 122a-122d are connected to gate voltage VG, and the transistors 122a-122d are all biased into the linear region. In some embodiments, the drain/source connections can be switched for at least one of the transistors 122a-122d.

The transistor 116d includes transistors 124a-124d connected in series with one drain/source of transistor 124a connected to the drain/source of transistor 122d in transistor cell 116c and the other drain/source of transistor 124a connected to one drain/source of transistor 124b. The other drain/source of transistor 124b is connected to the drain/source of the next transistor and so on, down to the drain/source of transistor 124d connected to a reference 126, such as ground. The drain/source paths of the transistors 124a-124d are connected in series from the drain/source of transistor 124*a* to the reference 126. Also, the gates of the transistors 124*a*-124*d* are connected to gate voltage VG, and the transistors 124*a*-124*d* are all biased into the linear region. In some embodiments, the drain/source connections can be switched for at least one of the transistors 124*a*-124*d*.

In one aspect the transistor cells 116*a*-116*d* are connected in series from the voltage VD to the reference 126, such that the drain/source paths of the transistors 118*a*-118*d*, 120*a*-120*d*, 122*a*-122*d*, and 124*a*-124*d* are connected in series from the voltage VD to the reference 126.

In some embodiments, the channel length of each of the transistors 118*a*-118*d*, 120*a*-120*d*, 122*a*-122*d*, and 124*a*-124*d* is a minimum channel length of the process node A of the multi-stage gate cell 100. In some embodiments, each of the transistors 118*a*-118*d*, 120*a*-120*d*, 122*a*-122*d*, and 124*a*-124*d* has the same channel length or a uniform channel length. In some embodiments, each of the transistors 118*a*-118*d*, 120*a*-120*d*, 122*a*-122*d*, and 124*a*-124*d* has a channel length of 3 nm. In some embodiments, at least one of the transistors 118*a*-118*d*, 120*a*-120*d*, 122*a*-122*d*, and 124*a*-124*d* has a different channel length, such that the channel lengths are mixed channel lengths.

The multi-stage stacked gate cell 100 is configured to provide an equivalent channel length that is equal to the channel length of multi-stage stacked gate cell 102 and longer channel length transistor 104. Thus, in some embodiments, the multi-gate stacked gate 100 can be used to replace the multi-stage stacked gate cell 102 and/or the longer channel length transistor 104. The multi-stage stacked gate cell 100 provides an equivalent longer channel that can be used to provide higher drain-to-source resistance Rds and improved current mismatch performance in circuits such as current mirrors.

Figure 2:
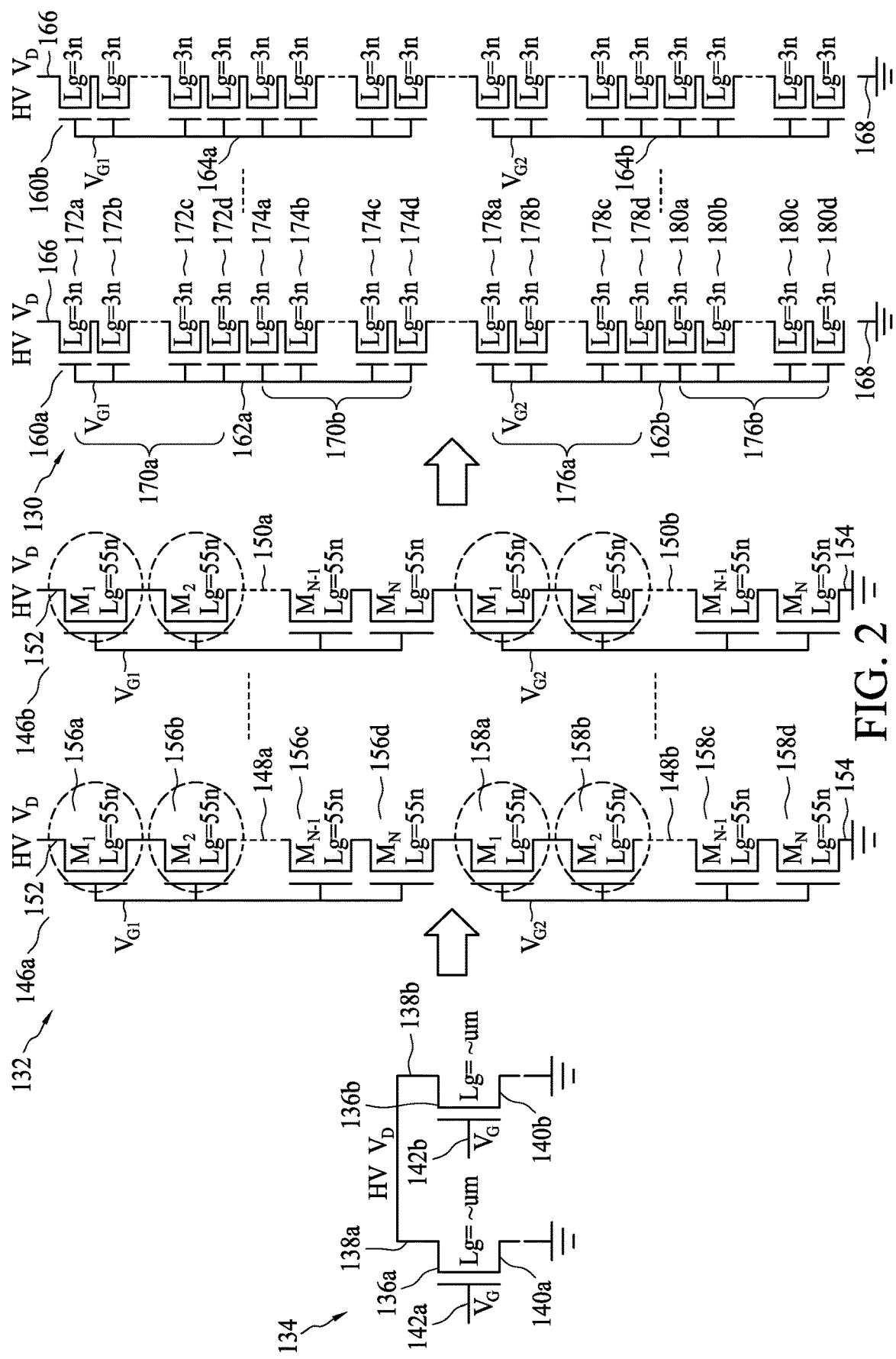
FIG. 2 is a diagram schematically illustrating parallel stacked gate cells configured for replacing a higher voltage I/O device, in accordance with some embodiments.

FIG. 2 is a diagram schematically illustrating parallel stacked gate cells 130 and 132 configured for replacing a higher voltage I/O device 134, in accordance with some embodiments. Each of the parallel stacked gate cells 130 and 132 is configured to replace the higher voltage I/O device 134, and the parallel stacked gate cell 130 is configured to replace the parallel stacked gate cell 132. In some embodiments, the parallel stacked gate cell 130 is from a newer process node A, the parallel stacked gate cell 132 is from an earlier process node B, and the higher voltage I/O device 134 is from the earliest process node C.

The higher voltage I/O device 134 is configured to be an I/O device that receives a high voltage (HV) voltage (VD). The higher voltage I/O device 134 includes two NMOS transistors 136*a* and 136*b* connected in parallel. Drain/source 138*a* of transistor 136*a* and drain/source 138*b* of transistor 136*b* are connected to each other and to receive the HV VD. Source/drain 140*a* of transistor 136*a* and source/drain 140*b* of transistor 136*b* are each connected to a reference, such as ground, and gate 142*a* of transistor 136*a* and gate 142*b* of transistor 136*b* are each connected to receive the gate voltage VG. In some embodiments, the higher voltage I/O device 134 has a channel length of 1 or more micrometers. In some embodiments, the higher voltage I/O device 134 includes PMOS transistors instead of NMOS transistors 136*a* and 136*b*.

The parallel stacked gate cell 132 includes C columns 146*a* to 146*b* of stacked gate cells. Each of the C columns 146*a* to 146*b* includes two multi-stage stacked gate cells, column 146*a* includes multi-stage stacked gate cells 148*a* and 148*b*, and column 146*b* includes multi-stage stacked gate cells 150*a* and 150*b*. The multi-stage stacked gate cells 148*a* and 148*b* in column 146*a* have their drain/source paths connected in series and the multi-stage stacked gate cells 150*a* and 150*b* in column 146*b* have their drain/source paths connected in series. Also, the multi-stage stacked gate cells 148*a* and 150*a* are connected to receive the same gate voltage VG1, and the multi-stage stacked gate cells 148*b* and 150*b* are connected to receive the same gate voltage VG2. Each of the C columns 146*a* to 146*b* receives the HV VD at 152 and is tied to a reference 154, such as ground, such that the drain/source paths of the columns 146*a* to 146*b* are in parallel. In other embodiments, each of the columns 146*a* to 146*b* can include more than 2 multi-stage stacked gate cells.

The multi-stage stacked gate cells 148*a* and 148*b* of column 146*a* are like and connected like the multi-stage stacked gate cells 150*a* and 150*b* of column 146*b*, such that to avoid unnecessary repetition only the multi-stage stacked gate cells 148*a* and 148*b* of column 146*a* are described below.

Multi-stage stacked gate cell 148*a* includes N stages of transistors 156*a*-156*d* connected in series with one drain/source of transistor 156*a* connected to receive the HV VD at 152 and the other drain/source of transistor 156*a* connected to one drain/source of transistor 156*b*. The other drain/source of transistor 156*b* is connected to one drain/source of the next transistor and so on, down to the drain/source of transistor 156*d* connected to multi-stage stacked gate cell 148*b*. The drain/source paths of the transistors 156*a*-156*d* are connected in series from the HV VD at 152 to the source/drain of transistor 156*d*. In some embodiments, the drain/source connections are switched for at least one of the transistors 156*a*-156*d*.

Multi-stage stacked gate cell 148*b* includes N stages of transistors 158*a*-158*d* connected in series with one drain/source of transistor 158*a* connected to the drain/source of transistor 156*d* and the other drain/source of transistor 158*a* connected to one drain/source of transistor 158*b*. The other drain/source of transistor 158*b* is connected to the drain/source of the next transistor and so on, down to the drain/source of transistor 158*d* connected to the reference 154. The drain/source paths of the transistors 158*a*-158*d* are connected in series from the drain/source of transistor 156*d* to the reference 154. Thus, the drain/source paths of the transistors 156*a*-156*d* and 158*a*-158*d* are connected in series from the HV VD at 152 to the reference 154. In some embodiments, the drain/source connections are switched for at least one of the transistors 158*a*-158*d*.

The gates of the transistors 156*a*-156*d* are connected to receive gate voltage VG1 and the gates of the transistors 158*a*-158*d* are connected to receive gate voltage VG2. The transistor 156*a* is biased into the saturation region and each of the transistors 156*b*-156*d* and 158*a*-158*d* is biased into the linear region. Also, each of the transistors 156*a*-156*d* and 158*a*-158*d* is an NMOS transistor. In other embodiments, one or more of the transistors 156*a*-156*d* and 158*a*-158*d* is a PMOS transistor.

In some embodiments, the channel length of each of the transistors 156*a*-156*d* and 158*a*-158*d* is a minimum channel length of the process node B. In some embodiments, each of the transistors 156*a*-156*d* and 158*a*-158*d* has the same channel length or a uniform channel length. In some embodiments, each of the transistors 156*a*-156*d* and 158*a*-158*d* has a channel length of 55 nanometers (nm). In some embodiments, at least one of the transistors 156*a*-156*d* and 158*a*-158*d* has a different channel length, such that the channel lengths of the transistors 156*a*-156*d* and 158*a*-158*d* are mixed channel lengths. The stacked gate cells of column 146*b* are like the stacked gate cells of column 146*a*.

The parallel stacked gate cell 132, including the columns 146a to 146b of stacked gate cells, is configured to provide an equivalent channel length that is equal to the equivalent channel length of the higher voltage I/O device 134, such that the parallel stacked gate cell 132 can be used to replace the higher voltage I/O device 134. The parallel stacked gate cell 132 provides an equivalent longer channel that can be used to provide higher drain-to-source resistance Rds and improved current mismatch performance in circuits such as current mirrors. Also, the parallel stacked gate cell 132 is configured to handle the HV VD at 152 and provide the functions of an I/O device.

The parallel stacked gate cell 130 includes C columns 160a to 160b of stacked gate cells. Each of the C columns 160a to 160b includes multiple multi-stage stacked gate cells, column 160a includes multi-stage stacked gate cells 162a to 162b, and column 160b includes multi-stage stacked gate cells 164a to 164b. The multi-stage stacked gate cells 162a to 162b in column 160a have their drain/source paths connected in series and the multi-stage stacked gate cells 164a to 164b in column 160b have their drain/source paths connected in series. Also, the multi-stage stacked gate cells 162a and 164a are connected to receive the same gate voltage VG1, and the multi-stage stacked gate cells 162b and 164b are connected to receive the same gate voltage VG2. Each of the C columns 160a to 160b receives the HV VD at 166 and is tied to a reference 168, such as ground, such that the drain/source paths of the columns 160a to 160b are in parallel.

The multi-stage stacked gate cells 162a to 162b of column 160a are like and connected like the multi-stage stacked gate cells 164a to 164b of column 160b, such that to avoid unnecessary repetition only the multi-stage stacked gate cells 162a to 162b of column 160a are described below.

The multi-stage stacked gate cell 162a includes N transistor cells including transistor cells 170a and 170b, where each of the transistor cells, such as transistor cells 170a and 170b, is a replacement for a corresponding one of the N transistors 156a-156d in the parallel stacked gate cell 132. Also, each of the transistor cells, such as transistor cells 170a and 170b, has the same number of transistors as the other transistor cells 170a and 170b.

The transistor cell 170a is a replacement for the transistor 156a and includes transistors 172a-172d. The transistor cell 170b is a replacement for the transistor 156b and includes transistors 174a-174d, and so on, down to the transistor cell (not shown) that is a replacement for the transistor 156d. Each of the transistors 172a-172d and 174a-174d is an NMOS transistor. In other embodiments, one or more of the transistors 172a-172d and 174a-174d is a PMOS transistor and, in other embodiments, the transistors 172a-172d and 174a-174d are a mixture of NMOS and PMOS transistors.

The transistor cell 170a includes transistors 172a-172d connected in series with one drain/source of transistor 172a connected to receive the HV VD at 166 and the other drain/source of transistor 172a connected to one drain/source of transistor 172b. The other drain/source of transistor 172b is connected to the drain/source of the next transistor and so on, down to the drain/source of transistor 172d being connected to the drain/source of transistor 174a in the next transistor cell 170b. The drain/source paths of the transistors 172a-172d are connected in series from the HV VD at 166 to the drain/source of transistor 174a. The gates of the transistors 172a-172d are connected to gate voltage VG1. In this configuration, the transistor 172a is biased into the saturation region and each of the transistors 172b-172d is biased into the linear region. In some embodiments, the drain/source connections are switched for at least one of the transistors 172a-172d.

The transistor cell 170b includes transistors 174a-174d connected in series with one drain/source of transistor 174a connected to the drain/source of transistor 172d and the other drain/source of transistor 174a connected to one drain/source of transistor 174b. The other drain/source of transistor 174b is connected to the drain/source of the next transistor and so on, down to the drain/source of transistor 174d connected to the drain/source of the next transistor in the next transistor cell. The drain/source paths of the transistors 174a-174d are connected in series from the drain/source of transistor 174a to the drain/source of the next transistor in the next transistor cell. Also, the gates of the transistors 174a-174d are connected to gate voltage VG1, and the transistors 174a-174d are all biased into the linear region. In some embodiments, the drain/source connections are switched for at least one of the transistors 174a-174d.

This continues down to the multi-stage stacked gate cell 162b which includes N transistor cells, including transistor cells 176a and 176b, where each of the transistor cells, such as transistor cells 176a and 176b, is a replacement for a corresponding one of the N transistors 158a-158d in the parallel stacked gate cell 132. Also, each of the transistor cells, such as transistor cells 176a and 176b, has the same number of transistors as the other transistor cells 176a and 176b.

The transistor cell 176a is a replacement for the transistor 158a and includes transistors 178a-178d. The transistor cell 176b is a replacement for the transistor 158b and includes transistors 180a-180d, and so on, down to the transistor cell (not shown) that is a replacement for the transistor 158d. Each of the transistors 178a-178d and 180a-180d is an NMOS transistor. In other embodiments, one or more of the transistors 178a-178d and 180a-180d is a PMOS transistor and, in other embodiments, the transistors 178a-178d and 180a-180d are a mixture of NMOS and PMOS transistors.

The transistor cell 176a includes transistors 178a-178d connected in series with one drain/source of transistor 178a connected to the drain/source of the transistor in the previous transistor cell and the other drain/source of transistor 178a connected to one drain/source of transistor 178b. The other drain/source of transistor 178b is connected to the drain/source of the next transistor and so on, down to the drain/source of transistor 178d being connected to the drain/source of transistor 180a in the next transistor cell 176b. The drain/source paths of the transistors 178a-178d are connected in series from the drain/source of transistor 178a to the drain/source of transistor 180a. The gates of the transistors 178a-178d are connected to gate voltage VG2. In this configuration, the transistors 178a-178d are each biased into the linear region. In some embodiments, the drain/source connections are switched for at least one of the transistors 178a-178d.

The transistor cell 176b includes transistors 180a-180d connected in series with one drain/source of transistor 180a connected to the drain/source of transistor 178d and the other drain/source of transistor 180a connected to one drain/source of transistor 180b. The other drain/source of transistor 180b is connected to the drain/source of the next transistor and so on, down to the drain/source of transistor 180d connected to the drain/source of the next transistor in the next transistor cell. Also, this continues until the last transistor cell in column 160a is connected to the reference 168. The drain/source paths of the transistors 180a-180d are connected in series from the drain/source of transistor 180a to the drain/source of the next transistor in the next transistor cell. Also, the gates of the transistors 180a-180d are connected to gate voltage VG2, and the transistors 180a-180d are all biased into the linear region. In some embodiments, the drain/source connections are switched for at least one of the transistors 180a-180d.

In one aspect the multi-stage stacked gate cells 162a to 162b of column 160a are connected in series from the HV VD at 166 to the reference 168, where the drain/source paths of the transistors 172a-172d, 174a-174d, 178a-178d, and 180a-180d are connected in series from the HV VD at 166 and through other transistor cells to the reference 168.

In some embodiments, the channel length of each of the transistors in column 160a including transistors 172a-172d, 174a-174d, 178a-178d, and 180a-180d is a minimum channel length of the process node A. In some embodiments, each of the transistors in column 160a including transistors 172a-172d, 174a-174d, 178a-178d, and 180a-180d has the same channel length or a uniform channel length. In some embodiments, each of the transistors in column 160a including transistors 172a-172d, 174a-174d, 178a-178d, and 180a-180d has a channel length of 3 nm. In some embodiments, at least one of the transistors in column 160a including transistors 172a-172d, 174a-174d, 178a-178d, and 180a-180d has a different channel length, such that the channel lengths are mixed channel lengths. The stacked gate cells of column 160b are like the stacked gate cells of column 160a.

The parallel stacked gate cell 130, including the columns 160a to 160b of stacked gate cells, is configured to provide an equivalent channel length that is equal to the equivalent channel length of the parallel stacked gate cell 132 and equal to the equivalent channel length of the higher voltage I/O device 134, such that the parallel stacked gate cell 130 can be used to replace the parallel stacked gate cell 132 and the higher voltage I/O device 134. The parallel stacked gate cell 130 provides an equivalent longer channel that can be used to provide higher drain-to-source resistance Rds and improved current mismatch performance in circuits such as current mirrors. Also, the parallel stacked gate cell 130 is configured to handle the HV VD at 166 and provide the functions of an I/O device.

FIG. 3 is a diagram schematically illustrating the current mismatch performance of a current mirror designed with transistors having larger channel lengths from an earlier process node and transistors having smaller channel lengths from a newer process node, in accordance with some embodiments. The current mismatch performance is measured in percentage of current mismatch, which is calculated as a first current I1 through a first device minus a second current I2 through a second device (of the same kind as the first device) divided by the quantity of the first current plus the second current divided by 2, i.e., the difference in the currents I1 and I2 divided by the average current of I1 and I2 or (I1−I2)/[(I1+I2)/2]. The current mismatch performance is measured in percentage mismatch for PMOS standard threshold voltage (Psvt) transistors and for NMOS standard threshold voltage (Nsvt) transistors. In some embodiments, 95 percent of the stacked gate transistors are operating in the linear region to provide a lower current mismatch percentage.

At 200, the first column on the left illustrates the current mismatch performance for the earlier process node and a channel length of 55 nm at various currents and drain to source voltages (Vds). At 202, the second column from the left illustrates the current mismatch performance for the newer process node and a channel length of 3 nm, where N equals 3, such that 3 transistors having a 3 nm channel length are used to replace one of the transistors having a 55 nm channel length from the earlier process node. At 204, the third column from the left illustrates the current mismatch performance for the newer process node and a channel length of 3 nm, where N equals 4, such that 4 transistors having a 3 nm channel length are used to replace one of the transistors having a 55 nm channel length from the earlier process node. At 206, the fourth column from the left illustrates the current mismatch performance for the newer process node and a channel length of 3 nm, where N equals 5, such that 5 transistors having a 3 nm channel length are used to replace one of the transistors having a 55 nm channel length from the earlier process node, and at 208, the fifth column from the left, which is the column on the right, illustrates the current mismatch performance for the newer process node and a channel length of 22 nm, where N equals 2, such that 2 transistors having a 22 nm channel length are used to replace one of the transistors having a 55 nm channel length from the earlier process node.

At 210, the top row illustrates the current mismatch performance at a current of 10 micro-amps (uA) and a Vds of 0.35 volts. At this current and Vds, the current mismatch percentage for the earlier process node and a channel length of 55 nm is Psvt: 9.7% and Nsvt: 12%. This is to be compared to the current mismatch percentage for the newer process node and a channel length of 3 nm, where N equals 3 of Psvt: 17.4% and Nsvt: 18.7%, the current mismatch percentage for the newer process node and a channel length of 3 nm, where N equals 4 of Psvt: 13.5% and Nsvt: 14.6%, the current mismatch percentage for the newer process node and a channel length of 3 nm, where N equals 5 of Psvt: <7.1% and Nsvt: <9.2%. and the current mismatch percentage for the newer process node and a channel length of 22 nm, where N equals 2 of Psvt: 9.9% and Nsvt: not available. Thus, the current mismatch percentage for the newer process node and a channel length of 3 nm, where N equals 5 of Psvt: <7.1% and Nsvt: <9.2% is lower than the current mismatch percentage for the earlier process node and a channel length of 55 nm of Psvt: 9.7% and Nsvt: 12%.

At 212, the second row from the top illustrates the current mismatch performance at a current of 10 uA and a Vds of 0.05 volts. At this current and Vds, the current mismatch percentage for the earlier process node and a channel length of 55 nm is Psvt: 9.7% and Nsvt: 7%. This is to be compared to the current mismatch percentage for the newer process node and a channel length of 3 nm, where N equals 3 of Psvt: 7.5% and Nsvt: 9.9%, the current mismatch percentage for the newer process node and a channel length of 3 nm, where N equals 4 of Psvt: 4.5% and Nsvt: 6.2%, and the current mismatch percentage for the newer process node and a channel length of 22 nm, where N equals 2 of Psvt: 13.3% and Nsvt: not available. Thus, the current mismatch percentages for the newer process node and a channel length of 3 nm, where N equals 3 and 4 are lower than the current mismatch percentage for the earlier process node and a channel length of 55 nm of Psvt: 9.7% and Nsvt: 7%.

At 214, the third row from the top illustrates the current mismatch performance at a current of 5 uA and a Vds of 0.35 volts. At this current and Vds, the current mismatch percentage for the earlier process node and a channel length of 55 nm is Psvt: 12.1% and Nsvt: 15.0%. This is to be compared to the current mismatch percentage for the newer process node and a channel length of 3 nm, where N equals 3 of Psvt: 22.2% and Nsvt: 23.4%, the current mismatch percentage for the newer process node and a channel length of 3 nm, where N equals 4 of Psvt: 17.6% and Nsvt: 18.9%, the current mismatch percentage for the newer process node and a channel length of 3 nm, where N equals 5 of Psvt: 7.1% and Nsvt: 9.2%. and the current mismatch percentage for the newer process node and a channel length of 22 nm, where N equals 2 of Psvt: 13.3% and Nsvt: not available. Thus, the current mismatch percentage for the newer process node and a channel length of 3 nm, where N equals 5 of Psvt: 7.1% and Nsvt: 9.2% is lower than the current mismatch percentage for the earlier process node and a channel length of 55 nm of Psvt: 12.1% and Nsvt: 15.0%.

At 216, the fourth row from the top, or the last row, illustrates the current mismatch performance at a current of 5 uA and a Vds of 0.05 volts. At this current and Vds, the current mismatch percentage for the earlier process node and a channel length of 55 nm is Psvt: 14.9% and Nsvt: 10.0%. This is to be compared to the current mismatch percentage for the newer process node and a channel length of 3 nm, where N equals 3 of Psvt: 22.6% and Nsvt: 17.5%, the current mismatch percentage for the newer process node and a channel length of 3 nm, where N equals 4 of Psvt: 9.8% and Nsvt: 12.4%, and the current mismatch percentage for the newer process node and a channel length of 22 nm, where N equals 2 of Psvt: 17.4% and Nsvt: not available. Thus, the current mismatch percentage for the newer process node and a channel length of 3 nm, where N equals 4 is lower than the current mismatch percentage for the earlier process node and a channel length of 55 nm of Psvt: 14.9% and Nsvt: 10.0%.

Figure 4:
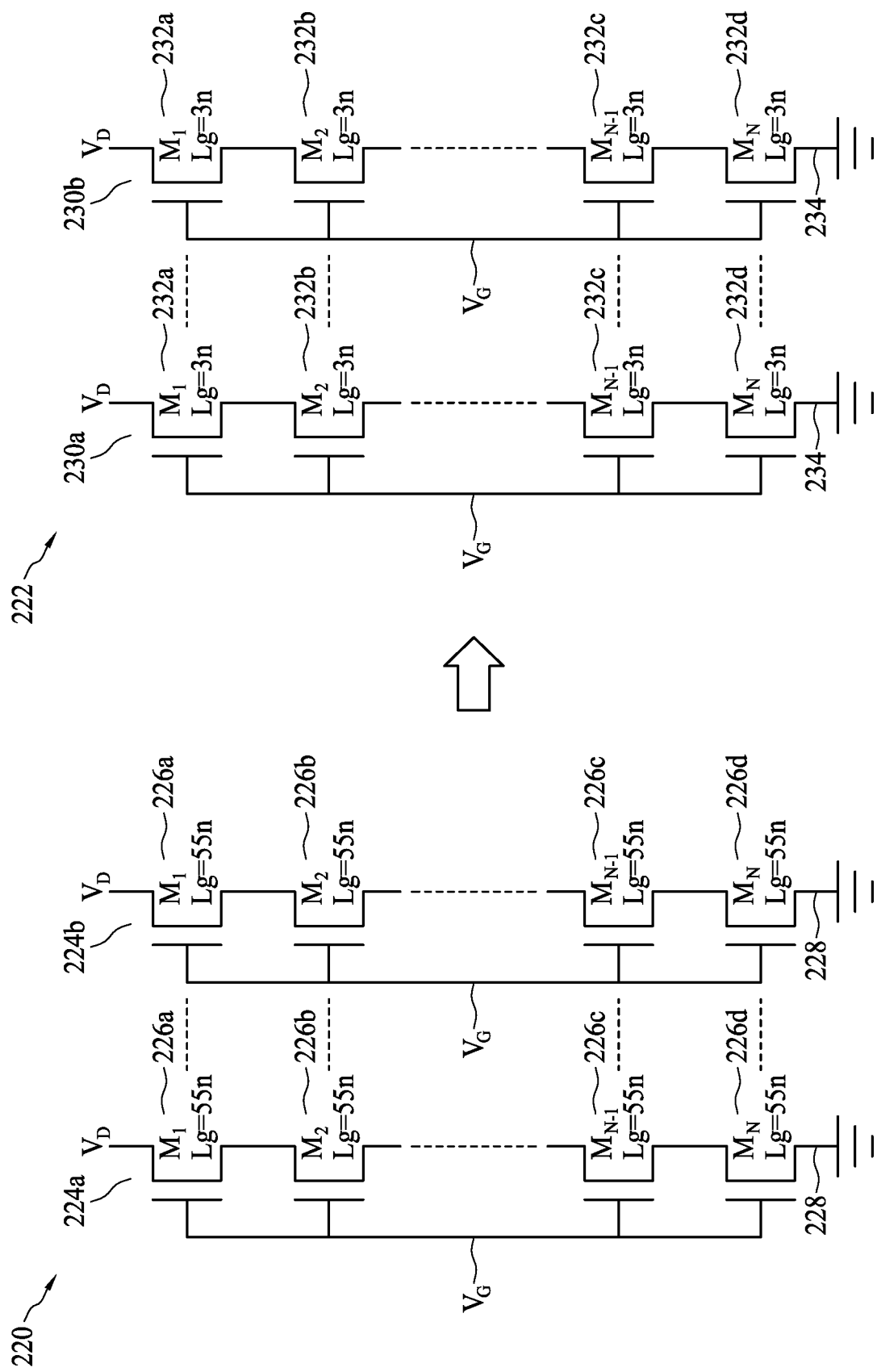
FIG. 4 is a diagram schematically illustrating a first parallel stacked gate cell from an earlier process node ported to provide a second parallel stacked gate cell from a newer process node, in accordance with some embodiments.

FIG. 4 is a diagram schematically illustrating a first parallel stacked gate cell 220 from an earlier process node ported to provide a second parallel stacked gate cell 222 from a newer process node, in accordance with some embodiments.

The first parallel stacked gate cell 220 includes C columns 224a to 224b of stacked gate cell transistors. Each of the C columns 224a to 224b includes N stages of transistors 226a-226d connected in series with one drain/source of transistor 226a connected to receive the voltage VD and the other drain/source of transistor 226a connected to one drain/source of transistor 226b. The other drain/source of transistor 226b is connected to the drain/source of the next transistor and so on, down to the drain/source of transistor 226d connected to a reference 228, such as ground. The drain/source paths of the transistors 226a-226d are connected in series from the voltage VD to the reference 228. In some embodiments, the drain/source connections are switched for at least one of the transistors 226a-226d.

The gates of the transistors 226a-226d are connected to gate voltage VG. In some embodiments, the transistor 226a is biased into the saturation region and each of the transistors 226b-226d is biased into the linear region. Also, each of the transistors 226a-226d is an NMOS transistor. In other embodiments, one or more of the transistors 226a-226d is a PMOS transistor.

In some embodiments, the channel length of each of the transistors 226a-226d is a minimum channel length of the earlier process node. In some embodiments, each of the transistors 226a-226d has the same channel length or a uniform channel length. In some embodiments, each of the transistors 226a-226d has a channel length of 55 nm. In some embodiments, at least one of the transistors 226a-226d has a different channel length, such that the channel lengths of the transistors 226a-226d are mixed channel lengths.

The second parallel stacked gate cell 222 includes C columns 230a to 230b of stacked gate cell transistors. Each of the C columns 230a to 230b includes N stages of transistors 232a-232d connected in series with one drain/source of transistor 232a connected to receive the voltage VD and the other drain/source of transistor 232a connected to one drain/source of transistor 232b. The other drain/source of transistor 232b is connected to the drain/source of the next transistor and so on, down to the drain/source of transistor 232d connected to a reference 234, such as ground. The drain/source paths of the transistors 232a-232d are connected in series from the voltage VD to the reference 234. In some embodiments, the drain/source connections are switched for at least one of the transistors 232a-232d.

The gates of the transistors 232a-232d are connected to gate voltage VG. In some embodiments, the transistor 232a is biased into the saturation region and each of the transistors 232b-232d is biased into the linear region. Also, each of the transistors 232a-232d is an NMOS transistor. In other embodiments, one or more of the transistors 232a-232d is a PMOS transistor.

In some embodiments, the channel length of each of the transistors 232a-232d is a minimum channel length of the earlier process node. In some embodiments, each of the transistors 232a-232d has the same channel length or a uniform channel length. In some embodiments, each of the transistors 232a-232d has a channel length of 3 nm. In some embodiments, at least one of the transistors 232a-232d has a different channel length, such that the channel lengths of the transistors 232a-232d are mixed channel lengths.

The second parallel stacked gate cell 222 is configured to provide an equivalent channel length that is equal to the channel length of the first parallel stacked gate cell 220, such that the second parallel stacked gate cell 222 can be used to replace the first parallel stacked gate cell 220. The second parallel stacked gate cell 222 provides an equivalent channel length that can be used to provide higher drain-to-source resistance Rds and improved current mismatch performance in circuits such as current mirrors.

In this example, in the first parallel stacked gate cell 220, C is equal to four and N is equal to 100, such that there are 400 transistors in the first parallel stacked gate cell 220. In the second parallel stacked gate cell 222, C is equal to 4 and N is equal to 300 (100 times 3), such that there are 1200 transistors in the second parallel stacked gate cell 222. Each of the transistors 226a-226d in the first parallel stacked gate cell 220 has a channel length of 55 nm and each of the transistors 232a-232d in the second parallel stacked gate cell 222 has a channel length of 3 nm. The first parallel stacked gate cell 220 is ported to the second parallel stacked gate cell 222, where, in porting, each of the transistors 226a-226d in the first parallel stacked gate cell 220 is replaced with 3 transistors 232a-232d from the newer process node to provide the second parallel stacked gate cell 222.

FIG. 5 is a diagram schematically illustrating current mismatch performance and size of a multi-stage stacked gate cell from an earlier or previous process node and equivalent long channel devices from a newer process node, in accordance with some embodiments. In some embodiments, this example includes PMOS transistors in a current mirror.

At 240, the multi-stage stacked gate cell device of the earlier process node uses transistors having a channel length of 55 nm. The device has 36 columns and 26 stages or transistors in each column for a total of 936 transistors. The current mismatch 1-sigma is 0.3% and the size of the device is X 1.0.

At 242, in an original plan, the multi-stage stacked gate cell device of the newer process node uses transistors having a channel length of 3 nm. The device has 54 columns and 84 stages or transistors in each column for a total of 4536 transistors. The current mismatch 1-sigma is 0.3% and the size of the device is X 1.1.

At 244, the multi-stage stacked gate cell device of the newer process node uses transistors having a channel length of 3 nm. Each of the transistors having a 55 nm channel length is replaced by 3 of the transistors having a 3 nm channel length. Thus, the device has 36 columns and 26 times 3 or 78 stages or transistors in each column for a total of 2808 transistors. The current mismatch 1-sigma is 0.3% and the size of the device is X 0.68.

At 246, the multi-stage stacked gate cell device of the newer process node uses transistors having a channel length of 3 nm. Each of the transistors having a 55 nm channel length is replaced by 4 of the transistors having a 3 nm channel length. Thus, the device has 36 columns and 26 times 4 or 104 stages or transistors in each column for a total of 3744 transistors. The current mismatch 1-sigma is 0.25% and the size of the device is X 0.9.

At 248, the multi-stage stacked gate cell device of the newer process node uses transistors having a channel length of 22 nm. Each of the transistors having a 55 nm channel length is replaced by 2 of the transistors having a 22 nm channel length. Thus, the device has 36 columns and 26 times 2 or 52 stages or transistors in each column for a total of 1872 transistors. The current mismatch 1-sigma is 0.25% and the size of the device is X 1.03.

At 250, the multi-stage stacked gate cell device of the newer process node uses transistors having a channel length of 22 nm. Each of the transistors having a 55 nm channel length is replaced by 3 transistors having a 22 nm channel length. Thus, the device has 36 columns and 26 times 3 or 78 stages or transistors in each column for a total of 2808 transistors. The current mismatch 1-sigma is 0.16%, but the size of the device is X 1.26.

The multi-gate stacked cell device at 244 that includes transistors having channel lengths of 3 nm, where 3 transistors replace one of the transistors having a channel length of 55 nm provides a current mismatch 1-sigma of 0.3% and a smaller size of X 0.68. The multi-gate stacked cell device at 246 that includes transistors having channel lengths of 3 nm, where 4 transistors replace one of the transistors having a channel length of 55 nm provides a current mismatch 1-sigma of 0.25% and a smaller size of X 0.9. The multi-gate stacked cell device at 248 that includes transistors having channel lengths of 22 nm, where 2 transistors replace one transistor having a channel length of 55 nm provides a current mismatch 1-sigma of 0.25% and a larger size of X 1.03, and the multi-gate stacked cell device at 250 that includes transistors having channel lengths of 22 nm, where 3 transistors replace one transistor having a channel length of 55 nm provides a current mismatch 1-sigma of only 0.16%, but a larger size of X 1.26.

A further improvement in power, performance, and area can be obtained by using V stacked gate configurations in place of parallel stacked gate cells. V stacked gate configurations use fewer transistors than comparable parallel stacked gate configurations, which results in the V stacked gate configurations using less power, having better performance, and taking up a smaller area on the semiconductor chip. The V stacked gate configurations include transistors connected in series and transistors connected in parallel.

Figure 6:
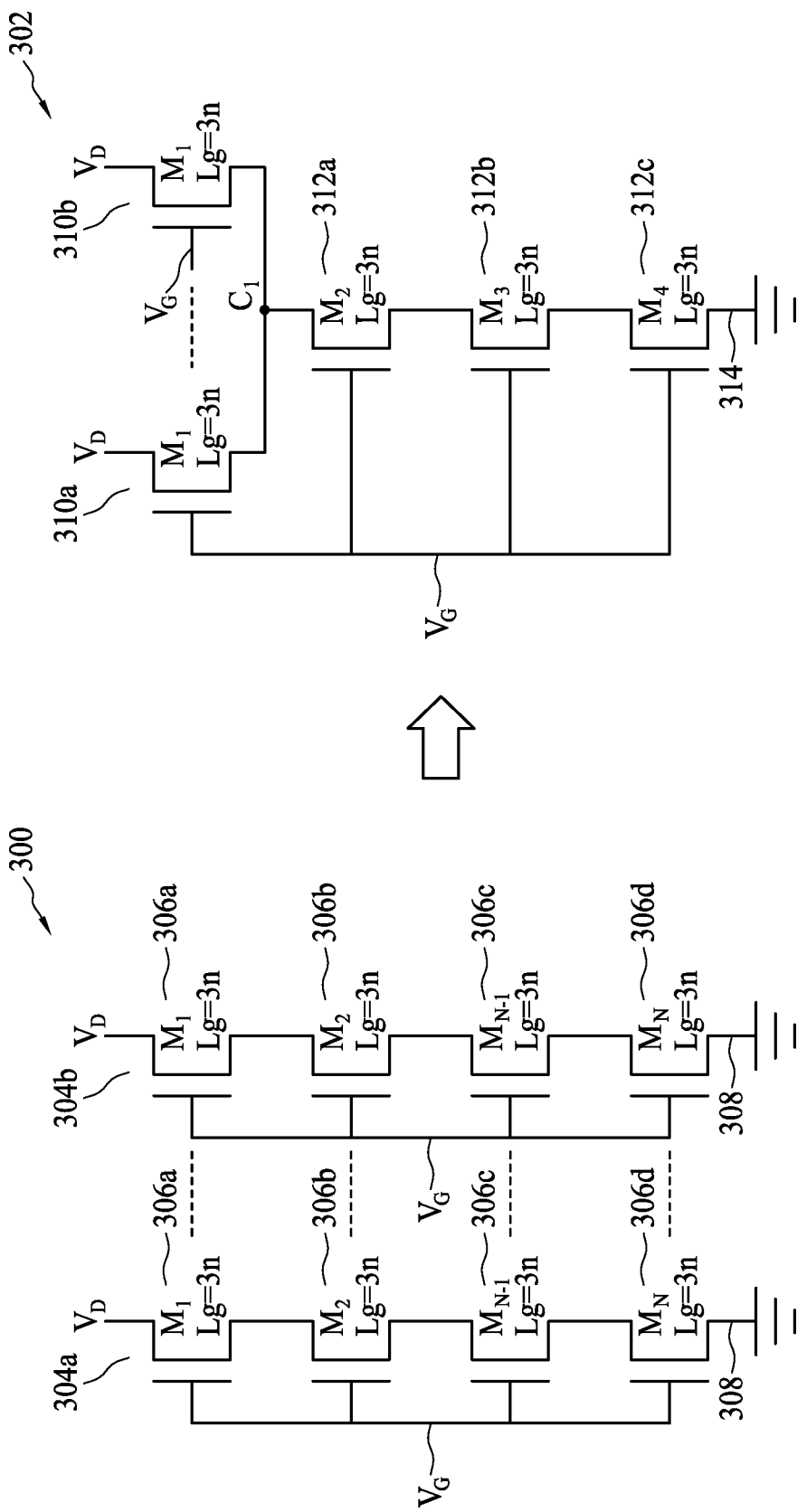
FIG. 6 is a diagram schematically illustrating a parallel stacked gate cell and a comparable replacement V stacked gate cell, in accordance with some embodiments.

FIG. 6 is a diagram schematically illustrating a parallel stacked gate cell 300 and a comparable replacement V stacked gate cell 302, in accordance with some embodiments. The parallel stacked gate cell 300 and the V stacked gate cell 302 are from the same process node and, in the present example, all transistors in the parallel stacked gate cell 300 and the V stacked gate cell 302 have a channel length of 3 nm. In other embodiments, the transistors in the parallel stacked gate cell 300 and the V stacked gate cell 302 can have any suitable channel lengths.

The parallel stacked gate cell 300 includes C columns 304a to 304b of stacked gate cell transistors. Each of the C columns 304a to 304b includes N=4 stages of transistors 306a-306d connected in series with one drain/source of transistor 306a connected to receive the voltage VD and the other drain/source of transistor 306a connected to one drain/source of transistor 306b. The other drain/source of transistor 306b is connected to the drain/source of the next transistor and so on, down to the drain/source of transistor 306d being connected to a reference 308, such as ground. The drain/source paths of the transistors 306a-306d are connected in series from the voltage VD to the reference 308. In some embodiments, the drain/source connections are switched for at least one of the transistors 306a-306d.

The gates of the transistors 306a-306d are connected to gate voltage VG. In some embodiments, the transistor 306a is biased into the saturation region and each of the transistors 306b-306d is biased into the linear region. Also, each of the transistors 306a-306d is an NMOS transistor. In other embodiments, one or more of the transistors 306a-306d is a PMOS transistor.

In some embodiments, the channel length of each of the transistors 306a-306d is a minimum channel length of the process node. In some embodiments, each of the transistors 306a-306d has the same channel length or a uniform channel length. In some embodiments, each of the transistors 306a-306d has a channel length of 3 nm. In some embodiments, at least one of the transistors 306a-306d has a different channel length, such that the channel lengths of the transistors 306a-306d are mixed channel lengths.

The comparable replacement V stacked gate cell 302 includes P=1 stage of transistors 310a to 310b connected in parallel and 3 transistors 312a-312c connected in series to each other and to the one parallel stage of transistors 310a to 310b. The V stacked gate cell 302 includes transistors 310a to 310b connected in parallel, with first drain/source regions of the transistors 310a to 310b connected to receive the voltage VD and second drain/source regions of the transistors 310a to 310b connected to each other at C1. Also, the gates of the transistors 310a to 310b are connected to receive the gate voltage VG.

The V stacked gate cell 302 further includes 3 transistors 312a-312c connected in series with one drain/source of transistor 312a connected to the drain/source regions of the transistors 310a to 310b at C1 and the other drain/source of transistor 312a connected to one drain/source of transistor 312b. The other drain/source of transistor 312b is connected to one drain/source of transistor 312c, and the other drain/source of transistor 312c is connected to a reference 314, such as ground. The drain/source paths of the transistors 312a-312c are connected in series from the parallel connected transistors 310a to 310b to the reference 314. The gates of the transistors 312a-312c are connected to gate voltage VG. In some embodiments, the drain/source connections are switched for at least one of the transistors 312a-312c.

Each of the transistors 310a to 310b and 312a-312c is an NMOS transistor. In other embodiments, one or more of the transistors 310a to 310b and 312a-312c is a PMOS transistor. In some embodiments, the channel length of each of the transistors 310a to 310b and 312a-312c is a minimum channel length of the process node. In some embodiments, each of the transistors 310a to 310b and 312a-312c has the same channel length or a uniform channel length. In some embodiments, each of the transistors 310a to 310b and 312a-312c has a channel length of 3 nm. In some embodiments, at least one of the transistors 310a to 310b and 312a-312c has a different channel length, such that the channel lengths of the transistors 310a to 310b and 312a-312c are mixed channel lengths.

In the current example, the parallel stacked gate cell 300 includes four columns, C=4, where each of the four columns includes four transistors 306a-306d, N=4. The V stacked gate cell 302 includes four transistors 310a to 310b connected in parallel and three transistors 312a-312c connected in series. Thus, the total number of transistors 306a-306d in the parallel stacked gate cell 300 is 4×4=16 and the total number of transistors 310a to 310b and 312a-312c in the V stacked gate cell is 4+3=7. A reduction of one transistor.

Figure 7:
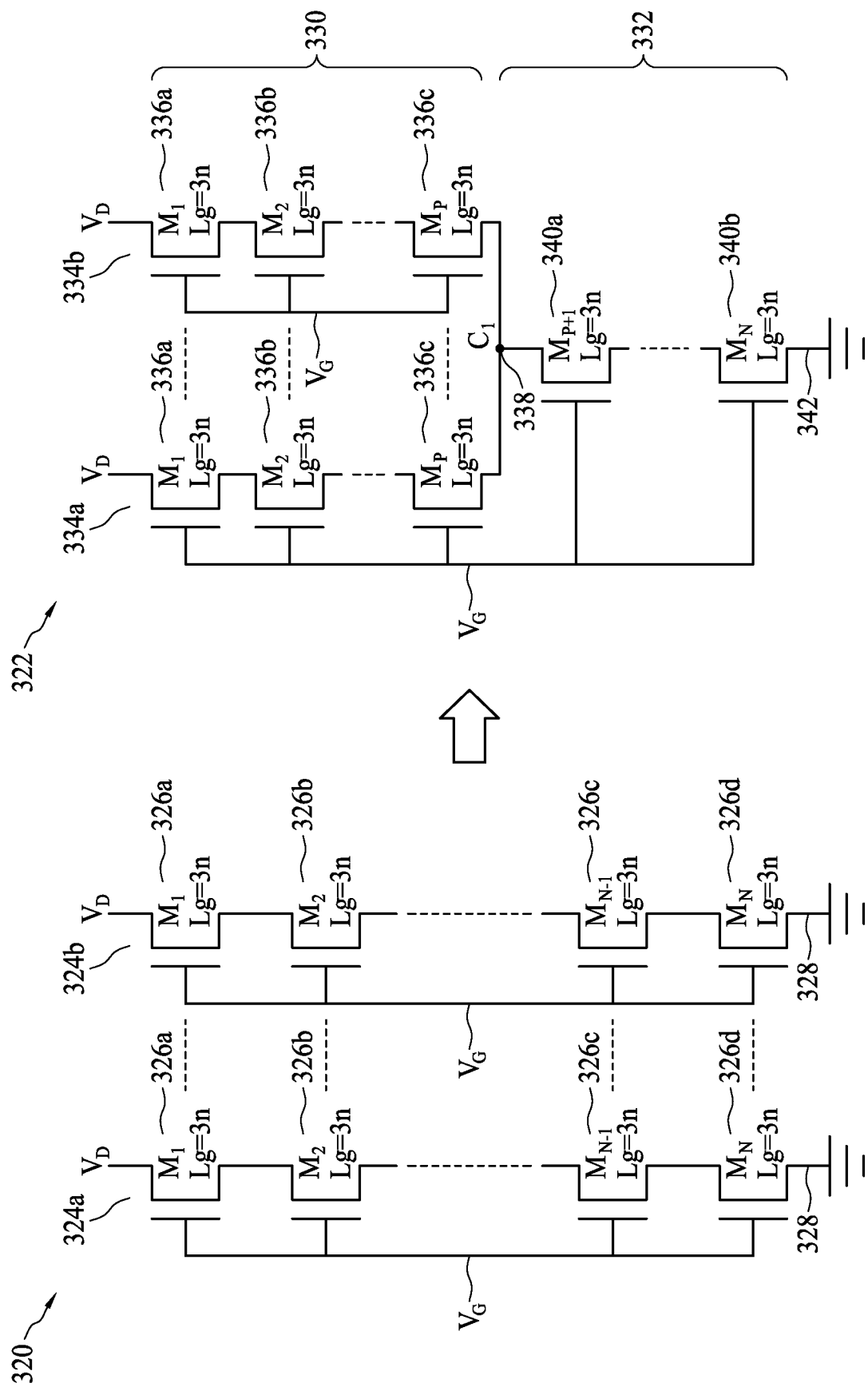
FIG. 7 is a diagram schematically illustrating the conversion of a parallel stacked gate cell to a V stacked gate cell, in accordance with some embodiments.

FIG. 7 is a diagram schematically illustrating the conversion of a parallel stacked gate cell 320 to a V stacked gate cell 322, in accordance with some embodiments. The parallel stacked gate cell 320 and the V stacked gate cell 322 are from the same process node and, in the present example, all transistors in the parallel stacked gate cell 320 and in the V stacked gate cell 322 have a channel length of 3 nm. In other embodiments, the transistors in the parallel stacked gate cell 320 and the V stacked gate cell 322 can have any suitable channel lengths.

The parallel stacked gate cell 320 includes C columns 324a to 324b of stacked gate cell transistors. Each of the C columns 324a to 324b includes N stages of transistors 326a-326d connected in series with one drain/source of transistor 326a connected to receive the voltage VD and the other drain/source of transistor 326a connected to one drain/source of transistor 326b. The other drain/source of transistor 326b is connected to the drain/source of the next transistor and so on, down to the drain/source of transistor 326d being connected to a reference 328, such as ground. The drain/source paths of the transistors 326a-326d are connected in series from the voltage VD to the reference 328. In some embodiments, the drain/source connections are switched for at least one of the transistors 326a-326d.

The gates of the transistors 326a-326d are connected to gate voltage VG. In some embodiments, the transistor 326a is biased into the saturation region and each of the transistors 326b-326d is biased into the linear region. Also, each of the transistors 326a-326d is an NMOS transistor. In other embodiments, one or more of the transistors 326a-326d is a PMOS transistor.

In some embodiments, the channel length of each of the transistors 326a-326d is a minimum channel length of the process node. In some embodiments, each of the transistors 326a-326d has the same channel length or a uniform channel length. In some embodiments, each of the transistors 326a-326d has a channel length of 3 nm. In some embodiments, at least one of the transistors 326a-326d has a different channel length, such that the channel lengths of the transistors 326a-326d are mixed channel lengths.

The replacement V stacked gate cell 322 includes a parallel stacked gate cell portion 330 connected in series with a series stacked gate cell portion 332. The parallel stacked gate cell portion 330 includes C columns 334a to 334b of stacked gate cell transistors, where each of the C columns 334a to 334b includes P stages of transistors 336a-336c connected in series with one drain/source of transistor 336a connected to receive the voltage VD and the other drain/source of transistor 336a connected to one drain/source of transistor 336b. The other drain/source of transistor 336b is connected to the drain/source of the next transistor and so on, down to the drain/source of transistor 336c being connected to all the other drain/source regions at C1 338 of the last transistors in the C columns. The drain/source paths of the transistors 336a-336c are connected in series from the voltage VD to the drain/source regions at C1 338 of the last transistors in the C columns. Also, all gates of the transistors 336a-336c are connected to receive the gate voltage VG. In some embodiments, the drain/source connections are switched for at least one of the transistors 336a-336c.

The series stacked gate cell portion 332 includes transistors 340a to 340b connected in series with one drain/source of transistor 340a connected to the drain/source regions at C1 338 of the last transistors in the C columns and the other drain/source of transistor 340a connected to the drain/source of the next transistor in the series, down to the drain/source of transistor 340b connected to a reference 342, such as ground. The number of transistors 340a to 340b in the series stacked gate cell portion 332 is equal to the total number of stages N in the V stacked gate cell 322 minus the P stages of transistors 336a-336c in the parallel stacked gate cell portion 330. The drain/source paths of the transistors 340a to 340b are connected in series from the drain/source regions at C1 338 of the last transistors in the C columns to the reference 342. The gates of the transistors 340a to 340b are also connected to gate voltage VG. In some embodiments, the drain/source connections are switched for at least one of the transistors 340a to 340b.

Each of the transistors 336a-336c and 340a to 340b is an NMOS transistor. In other embodiments, one or more of the transistors 336a-336c and 340a to 340b is a PMOS transistor. In some embodiments, the channel length of each of the transistors 336a-336c and 340a to 340b is a minimum channel length of the process node. In some embodiments, each of the transistors 336a-336c and 340a to 340b has the same channel length or a uniform channel length. In some embodiments, each of the transistors 336a-336c and 340a to 340b has a channel length of 3 nm. In some embodiments, at least one of the transistors 336a-336c and 340a to 340b has a different channel length, such that the channel lengths of the transistors 336a-336c and 340a to 340b are mixed channel lengths.

The parallel stacked gate cell 320 includes C columns of stacked gate cells, where each of the C columns includes N stages or transistors, such that the total number of transistors T is equal to C times N, i.e., C×N=T. The V stacked gate cell 322 includes the parallel stacked gate cell portion 330 with C columns, where each of the columns includes P stages of transistors plus the series stacked gate cell portion 332 of N total stages minus P stages of transistors, where the number of columns C and the total number of stages N are the same values for the parallel stacked gate cell 320 and for the V stacked gate cell 322. Thus, the number of transistors in the V stacked gate cell 322 is the quantity of C times P plus the quantity of N minus P, i.e., (C×P)+(N−P)=T, which results in a reduction of the number of transistors in the V stacked gate cell 322 as compared to the parallel stacked gate cell 320.

FIG. 8 is a diagram schematically illustrating reductions in the number of gates or transistors in a V stacked gate cell, such as V stacked gate cell 322, as compared to a parallel stacked gate cell, such as parallel stacked gate cell 320, in accordance with some embodiments.

At 350, in the top row, the total number of stages N in each of the parallel stacked gate cell and the V stacked gate cell is listed, where N=3 at 352, N=4 at 354, N=5 at 356, and N=6 at 358. At 360, in the first column on the left, the number of parallel stages P in the V stacked gate cell is listed and the number of columns C in each of the parallel stacked gate cell and the V stacked gate cell is listed, where P=1 for all and C=2 at 362, C=3 at 364, C=4 at 366, C=5 at 368, and C=6 at 370.

By way of example, at 372, the number of gates shrinks from 6 for the parallel stacked gate cell to 4 for the V stacked gate cell or 67% of the number of gates in the parallel stacked gate cell. The reductions in the number of gates or transistors are greater as the number of columns C increase, such as at 374 where the number of gates shrinks from 18 for the parallel stacked gate cell to 8 for the V stacked gate cell or 44.4% of the number of gates in the parallel stacked gate cell. Also, the reductions in the number of gates or transistors are greater as the total number of stages N increase, such as at 376 where the number of gates shrinks from 12 for the parallel stacked gate cell to 7 for the V stacked gate cell or 58.3% of the number of gates in the parallel stacked gate cell. In addition, the reductions in the number of gates or transistors are greater when both the number of columns C and the total number of stages N increase, such as at 378 where the number of gates shrinks from 36 for the parallel stacked gate cell to 11 for the V stacked gate cell, which is 30.6% of the number of gates in the parallel stacked gate cell.

Thus, the V stacked gate cell configurations use fewer transistors than comparable parallel stacked gate cell configurations, which results in the V stacked gate cells using less power, having better performance, and taking up a smaller area on the semiconductor chip.

FIG. 9 is a diagram schematically illustrating the current mismatch performance of a current mirror designed with parallel stacked gate cells and with V stacked gate cells, in accordance with some embodiments. The current mismatch performance is measured in percentage of current mismatch, which is calculated as a first current I1 through a first device minus a second current I2 through a second device (of the same kind as the first device) divided by the quantity of the first current plus the second current divided by 2, i.e., the difference in the currents I1 and I2 divided by the average current of I1 and I2 or (I1−I2)/[(I1+I2)/2]. The current mismatch performance is measured in percentage mismatch for Psvt transistors and for Nsvt transistors.

At 380, in the first column on the left, the current mismatch performance for the parallel stacked gate cells at a current of 10 uA and a Vds of 0.05 volts is shown. In the row at 382, the current mismatch performance is shown for the parallel stacked gate cells having N=3 to N=5 total stages and C=2 columns. In the row at 384, the current mismatch performance is shown for the parallel stacked gate cells having N=3 to N=5 total stages and C=3 columns and, in the row at 386, the current mismatch performance is shown for the parallel stacked gate cells having N=3 to N=5 total stages and C=4 columns. The current mismatch performance values shown in column 380 can be compared to corresponding values in the other 3 columns.

At 388, in the second column from the left, the current mismatch performance for the V stacked gate cell is shown, where N=3 and P=1. At 390, in the third column from the left, the current mismatch performance for the V stacked gate cell is shown, where N=4 and P=1. At 392, in the fourth or last column from the left, the current mismatch performance for the V stacked gate cell is shown, where N=5 and P=1.

By way of an example comparison, in the first column at 380 and the row at 382, for the parallel stacked gate cell where N=3 and C=2, the Psvt is 10.2% and the Nsvt is 12.4%. This can be compared to the column at 388 and the row at 382, for the V stacked gate cell where N=3 and P=1, and the Psvt is 9% and the Nsvt is 11.4%. Thus, the current mismatch performance is better for the V stacked gate cell than for the corresponding parallel stacked gate performance.

By way of another example comparison, in the first column at 380 and the row at 386, for the parallel stacked gate cell where N=5 and C=4, the Psvt is 6.8% and the Nsvt is 7.8%. This can be compared to the column at 392 and the row at 386, for the V stacked gate cell where N=5 and P=1, and the Psvt is 3.9% and the Nsvt is 5.5%. Thus, the current mismatch performance is better for the V stacked gate cell than for the corresponding parallel stacked gate performance. This continues throughout FIG. 9 with one exception.

In the first column at 380 and the row at 386, for the parallel stacked gate cell where N=3 and C=4, the Psvt is 10.5% and the Nsvt is 12.1%. This can be compared to the column at 388 and the row at 386 for the V stacked gate cell where N=3 and P=1, and the Psvt is 10.6% and the Nsvt is 13.7%.

Figure 10:
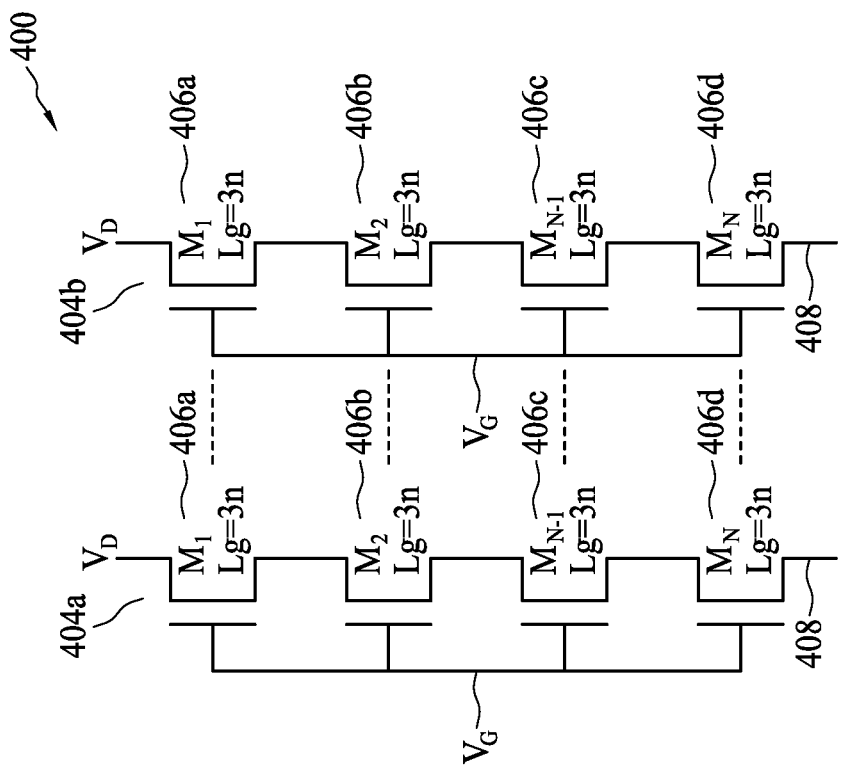
FIG. 10 is a diagram schematically illustrating the stacked gate cell having C=4 columns and N=4 stages per column, in accordance with some embodiments.
Figure 11:
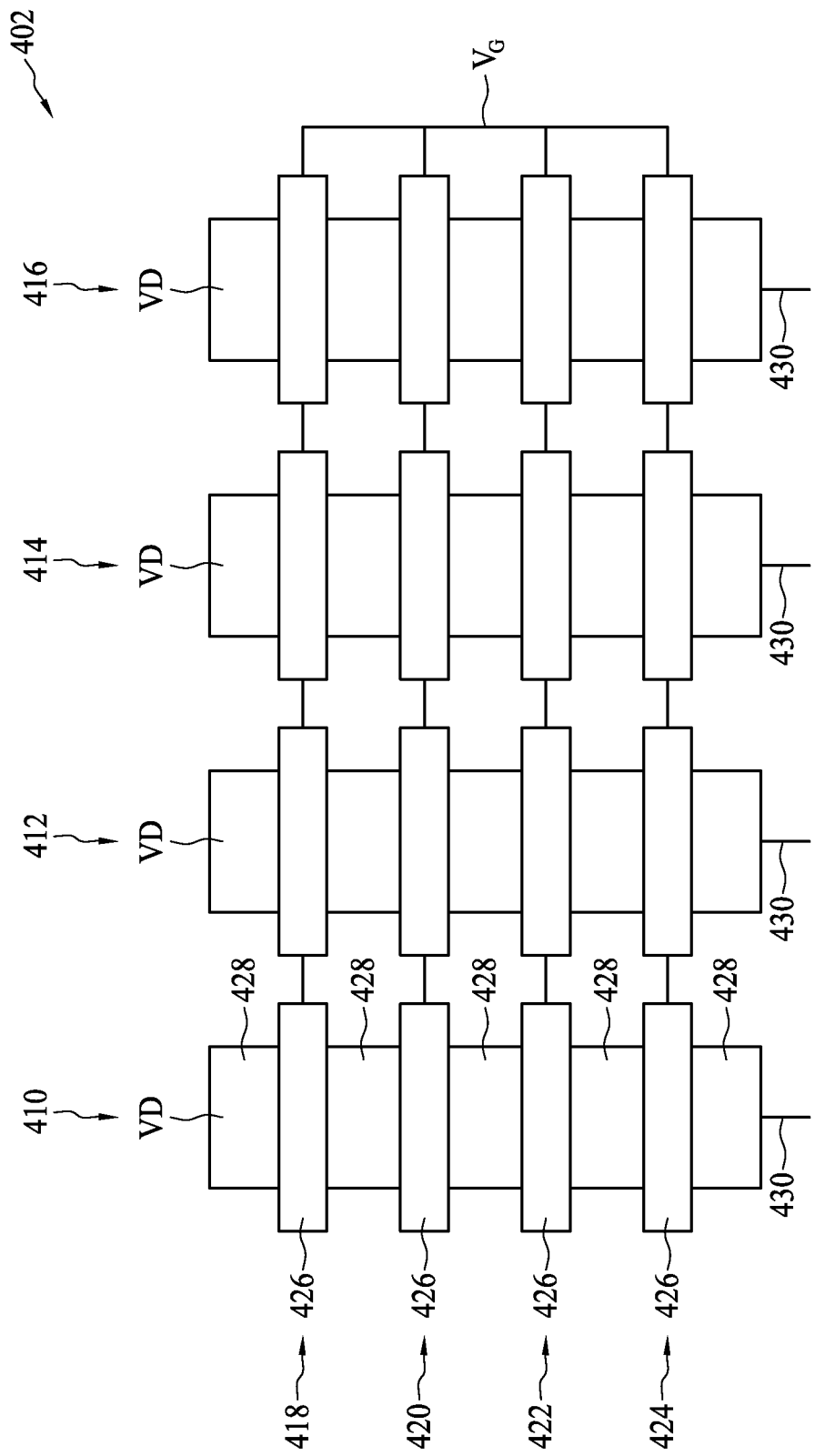
FIG. 11 is a diagram schematically illustrating the stacked gate cell of FIG. 10, in accordance with some embodiments.

FIGS. 10 and 11 are diagrams schematically illustrating a stacked gate cell 400 and a semiconductor device 402 of the stacked gate cell 400, in accordance with some embodiments. FIG. 10 is a diagram schematically illustrating the stacked gate cell 400 having C=4 columns and N=4 stages per column, in accordance with some embodiments. FIG. 11 is a diagram schematically illustrating the semiconductor device 402 of the stacked gate cell 400, in accordance with some embodiments. In some embodiments, throughout this disclosure, the semiconductor devices disclosed herein include corresponding layouts of the devices.

The stacked gate cell 400 includes C=4 columns 404a to 404b. Each of the C=4 columns 404a to 404b includes N=4 stages of transistors 406a-406d connected in series with one drain/source of transistor 406a connected to receive the voltage VD and the other drain/source of transistor 406a connected to one drain/source of transistor 406b. The other drain/source of transistor 406b is connected to one drain/source of transistor 406c and the other drain/source of transistor 406c is connected to one drain/source of transistor 406d. The other drain/source of transistor 406d includes a connection 408 that can be connected to another cell or to a reference, such as ground. The drain/source paths of the transistors 406a-406d are connected in series from the voltage VD to the connection 408. The total number of transistors (gates) 406a-406d in the stacked gate cell 400 is C×N=T, or 4×4=16. In some embodiments, the drain/source connections are switched for at least one of the transistors 406a-406d.

The gates of the transistors 406a-406d in all four columns 404a to 404b are connected to gate voltage VG. In some embodiments, the transistor 406a is biased into the saturation region and each of the transistors 406b-406d is biased into the linear region. Also, each of the transistors 406a-406d is an NMOS transistor. In other embodiments, one or more of the transistors 406a-406d is a PMOS transistor.

In some embodiments, the channel length of each of the transistors 406a-406d is a minimum channel length of the process node. In some embodiments, each of the transistors 406a-406d has the same channel length or a uniform channel length. In some embodiments, each of the transistors 406a-406d has a channel length of 3 nm. In some embodiments, at least one of the transistors 406a-406d has a different channel length, such that the channel lengths of the transistors 406a-406d are mixed channel lengths.

As illustrated in FIG. 11, the semiconductor device 402 includes four semiconductor structures or transistor stacks 410, 412, 414, and 416 that correspond to the four columns 404a to 404b. Each of the transistor stacks 410, 412, 414, and 416 corresponds to one of the four columns 404a to 404b. The transistor stack 410 corresponds to the column 404a, the transistor stacks 412 and 414 correspond to the columns not shown between columns 404a and 404b, and the transistor stack 416 corresponds to the column 404b. Also, each of the transistor stacks 410, 412, 414, and 416 includes four transistors 418, 420, 422, and 424 corresponding to the transistors 406a-406d. Each of the four transistors 418, 420, 422, and 424 includes a gate 426 and drain/source regions 428. The total number of transistors (gates) 418, 420, 422, and 424 in the semiconductor device 402 of stacked gate cell 400 is 4×4=16.

As with the stacked gate cell 400, each of the four transistor stacks 410, 412, 414, and 416 includes four transistors 418, 420, 422, and 424 connected in series with one drain/source of transistor 418 connected to receive the voltage VD and the other drain/source of transistor 418 connected to one drain/source of transistor 420. The other drain/source of transistor 420 is connected to one drain/source of transistor 422 and the other drain/source of transistor 422 is connected to one drain/source of transistor 424. The other drain/source of transistor 424 is connected to a connection 430 that can be connected to another cell or stack, or connected to a reference, such as ground. The drain/source paths of the transistors 418, 420, 422, and 424 are connected in series from the voltage VD to the connection 430. Also, all the transistor gates 426 in all four transistor stacks 410, 412, 414, and 416 are connected to gate voltage VG. In some embodiments, each of the four transistors 418, 420, 422, and 424 includes a bulk terminal and all bulk terminals are connected to each other and to a voltage reference value.

Figure 12:
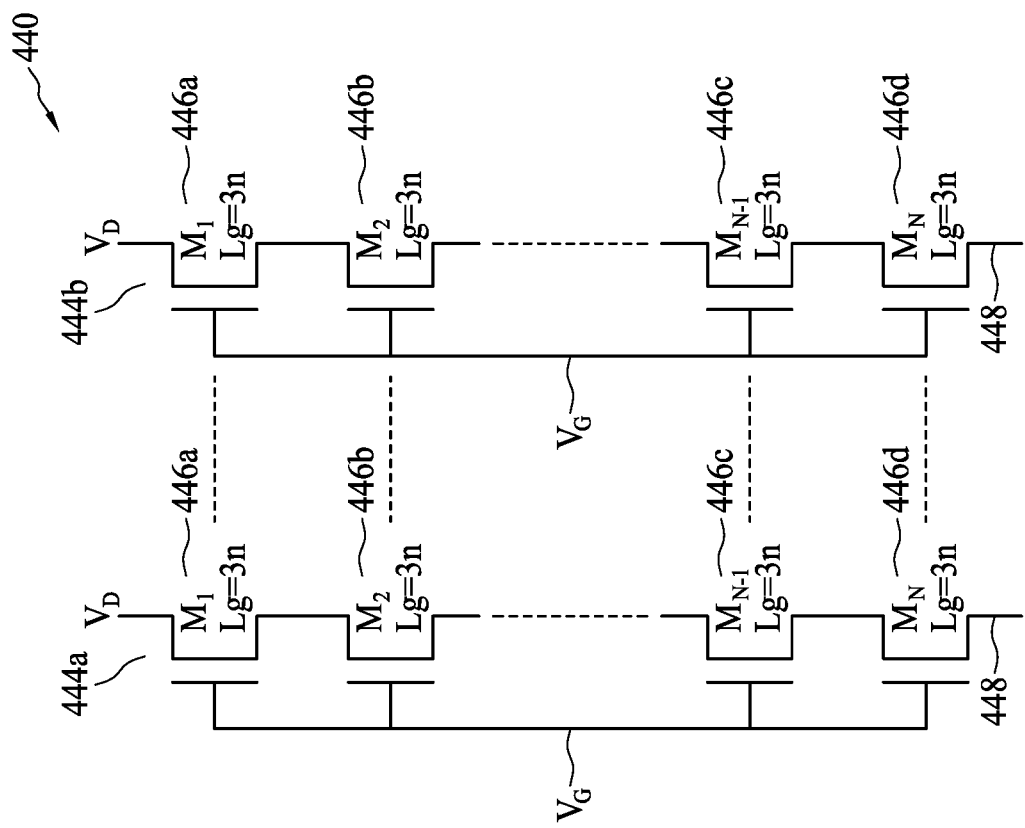
FIG. 12 is a diagram schematically illustrating the stacked gate cell having C columns and N stages per column, in accordance with some embodiments.
Figure 13:
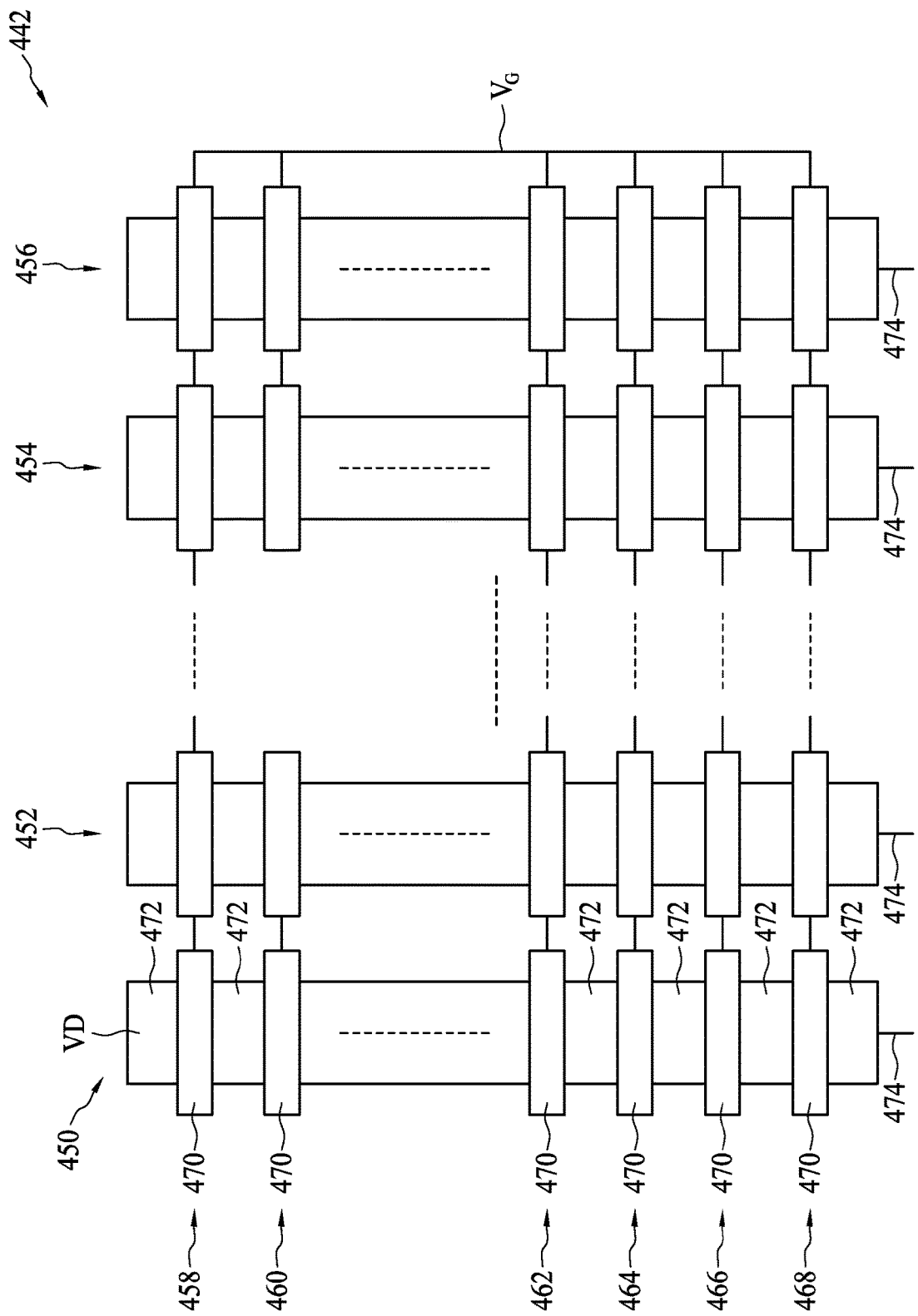
FIG. 13 is a diagram schematically illustrating the stacked gate cell of FIG. 12, in accordance with some embodiments.

FIGS. 12 and 13 are diagrams schematically illustrating a broader example of a stacked gate cell 440 and a semiconductor device 442 of the stacked gate cell 440, in accordance with some embodiments. FIG. 12 is a diagram schematically illustrating the stacked gate cell 440 having C columns and N stages per column, in accordance with some embodiments. FIG. 13 is a diagram schematically illustrating the semiconductor device 442 of the stacked gate cell 440, in accordance with some embodiments.

The stacked gate cell 440 includes C columns 444a to 444b. Each of the C columns 444a to 444b includes N stages of transistors 446a-446d connected in series with one drain/source of transistor 446a connected to receive the voltage VD and the other drain/source of transistor 446a connected to one drain/source of transistor 446b. The other drain/source of transistor 446b is connected to the next transistor in line, and this continues down to the drain/source of transistor 446d connected to a connection 448 that can be connected to another cell or a reference, such as ground. The drain/source paths of the transistors 446a-446d are connected in series from the voltage VD to the connection 448. The total number of transistors (gates) 446a-446d in the stacked gate cell 440 is C×N=T. In some embodiments, the drain/source connections are switched for at least one of the transistors 446a-446d.

The gates of the transistors 446a-446d in all C columns 444a to 444b are connected to the gate voltage VG. In some embodiments, the transistor 446a is biased into the saturation region and each of the transistors 446b-446d is biased into the linear region. Also, each of the transistors 446a-446d is an NMOS transistor. In other embodiments, one or more of the transistors 446a-446d is a PMOS transistor.

In some embodiments, the channel length of each of the transistors 446a-446d is a minimum channel length of the process node. In some embodiments, each of the transistors 446a-446d has the same channel length or a uniform channel length. In some embodiments, each of the transistors 446a-446d has a channel length of 3 nm. In some embodiments, at least one of the transistors 446a-446d has a different channel length, such that the channel lengths of the transistors 446a-446d are mixed channel lengths.

As illustrated in FIG. 13, the semiconductor device 442 includes C transistor stacks 450, 452, 454, and 456 that correspond to the C columns 444a to 444b. Each of the transistor stacks 450, 452, 454, and 456 corresponds to one of the C columns 444a to 444b. The transistor stack 450 corresponds to the column 444a, the transistor stacks 452 and 454 correspond to columns not shown between columns 444a and 444b, and the transistor stack 456 corresponds to the column 444b. Also, each of the transistor stacks 450, 452, 454, and 456 includes N transistors 458, 460, 462, 464, 466, and 468 corresponding to the transistors 446a-446d. Each of the transistors 458, 460, 462, 464, 466, and 468 includes a gate 470 and drain/source regions 472. The total number of transistors (gates) 458, 460, 462, 464, 466, and 468 in the semiconductor device 442 of stacked gate cell 440 is C×N=T.

As with the stacked gate cell 440, each of the C transistor stacks 450, 452, 454, and 456 includes N transistors 458, 460, 462, 464, 466, and 468 connected in series with one drain/source of transistor 458 connected to receive the voltage VD and the other drain/source of transistor 458 connected to one drain/source of transistor 460. The other drain/source of transistor 460 is connected to one drain/source of the next transistor, and so on, down to the drain/source of transistor 464 connected to a connection 474 that can be connected to another cell or stack, or connected to a reference, such as ground. The drain/source paths of the transistors 458, 460, 462, 464, 466, and 468 are connected in series from the voltage VD to the connection 474. Also, all the transistor gates 470 in all C transistor stacks 450, 452, 454, and 456 are connected to gate voltage VG. In some embodiments, each of the N transistors 458, 460, 462, 464, 466, and 468 includes a bulk terminal and all bulk terminals are connected to each other and a voltage reference value.

Figure 14:
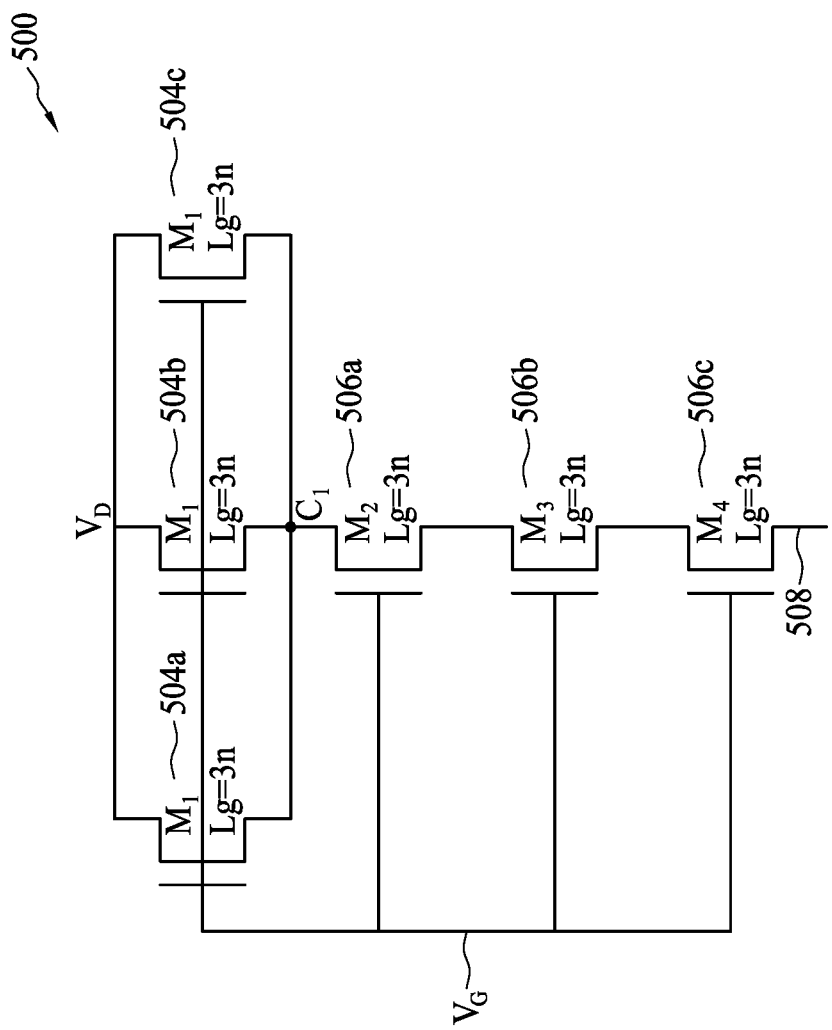
FIG. 14 is a diagram schematically illustrating the V stacked gate cell having P=1 parallel stage and N=4 total stages, in accordance with some embodiments.
Figure 15A:
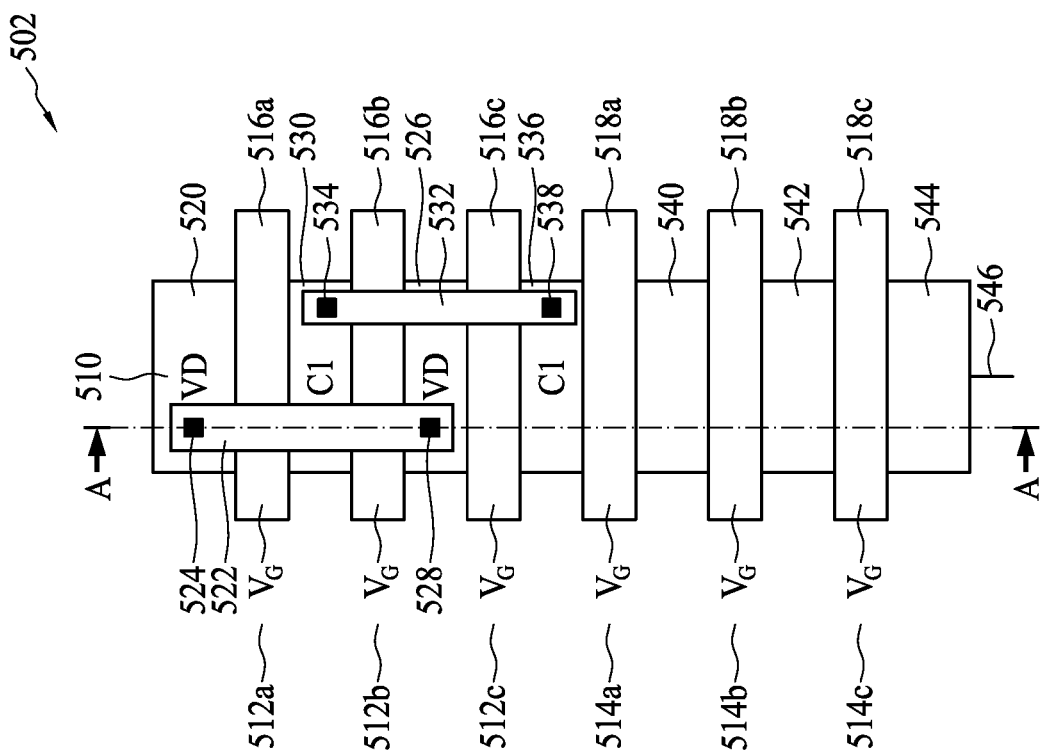
FIG. 15A is a diagram schematically illustrating the stacked gate cell of FIG. 14, in accordance with some embodiments.

FIGS. 14 and 15A are diagrams schematically illustrating a V stacked gate cell 500 and a semiconductor device 502 of the V stacked gate cell 500, in accordance with some embodiments. FIG. 14 is a diagram schematically illustrating the V stacked gate cell 500 having P=1 parallel stages and N=4 total stages, in accordance with some embodiments. FIG. 15A is a diagram schematically illustrating the semiconductor device 502 of the stacked gate cell 500, in accordance with some embodiments.

The V stacked gate cell 500 includes one parallel stage of three transistors 504a-504c and three transistors 506a-506c connected in series to the parallel stage transistors 504a-504c and to each other. The V stacked gate cell 500 includes transistors 504a-504c connected in parallel, with first drain/source regions of the transistors 504a-504c connected to receive the voltage VD and second drain/source regions of the transistors 504a-504c connected to each other at C1. Also, the gates of the transistors 504a-504c are connected to receive the gate voltage VG.

The V stacked gate cell 500 further includes the three transistors 506a-506c connected in series with one drain/source of transistor 506a connected to the other drain/source regions of the transistors 504a-504c at C1 and the other drain/source of transistor 506a connected to one drain/source of transistor 506b. The other drain/source of transistor 506b is connected to one drain/source of transistor 506c, and the other drain/source of transistor 506c is connected to a connection 508 that can be connected to another cell or a reference, such as ground. The drain/source paths of the transistors 506a-506c are connected in series from the parallel connected transistors 504a-504c to the connection 508. The gates of the transistors 506a-506c are connected to gate voltage VG. In some embodiments, the drain/source connections are switched for at least one of the transistors 506a-506c.

Each of the transistors 504a-504c and 506a-506c is an NMOS transistor. In other embodiments, one or more of the transistors 504a-504c and 506a-506c is a PMOS transistor. In some embodiments, the channel length of each of the transistors 504a-504c and 506a-506c is a minimum channel length of the process node. In some embodiments, each of the transistors 504a-504c and 506a-506c has the same channel length or a uniform channel length. In some embodiments, each of the transistors 504a-504c and 506a-506c has a channel length of 3 nm. In some embodiments, at least one of the transistors 504a-504c and 506a-506c has a different channel length, such that the channel lengths of the transistors 504a-504c and 506a-506c are mixed channel lengths.

In the current example, the V stacked gate cell 500 includes three transistors 504a-504c connected in parallel and three transistors 506a-506c connected in series. Thus, the total number of transistors is 3+3=6. In some embodiments, the V stacked gate cell 500 was converted from a parallel stacked gate cell having C=3 columns with N=4 transistors in each column, such that the total number of transistors in the parallel stacked gate cell was 3×4=12 and the conversion resulted in a reduction of six transistors.

In FIG. 15A, the semiconductor device 502 of the V stacked gate cell 500 includes a transistor stack or semiconductor structure 510 that includes three transistors 512a-512c connected in parallel to each other, and three transistors 514a-514c connected in series to each other and to the three transistors 512a-512c. Each of the transistors 512a-512c includes a gate 516a-516c, respectively, and each of the transistors 514a-514c includes a gate 518a-518c, respectively. Also, all the transistor gates 516a-516c and 518a-518c are connected to gate voltage VG. In some embodiments, each of the transistors 512a-512c and 514a-514c includes a bulk terminal and all bulk terminals are connected to each other and to a voltage reference value.

Transistor 512a includes a drain/source 520 connected to receive voltage VD and connected to a VD conductor 522 by via 524. Drain/source 520 is further connected to a drain/source 526 of transistors 512b and 512c through the VD conductor 522 by via 528. Also, transistors 512a and 512b share drain/source 530 that is connected to a C1 conductor 532 by via 534, which is connected to shared drain/source 536 of transistors 512c and 514a by via 538. From there, transistors 514a-514c are connected in series with shared drain/source 540 of transistors 514a and 514b, and shared drain/source 542 of transistors 514b and 514c, and drain/source 544 of transistor 514c connected to a connection 546 that can be connected to another cell or stack, or connected to a reference, such as ground. The layout 502 includes a drain/source path from the voltage VD to the connection 546. The total number of transistors (gates) in the layout 502 is 3+3=6.

Figure 15B:
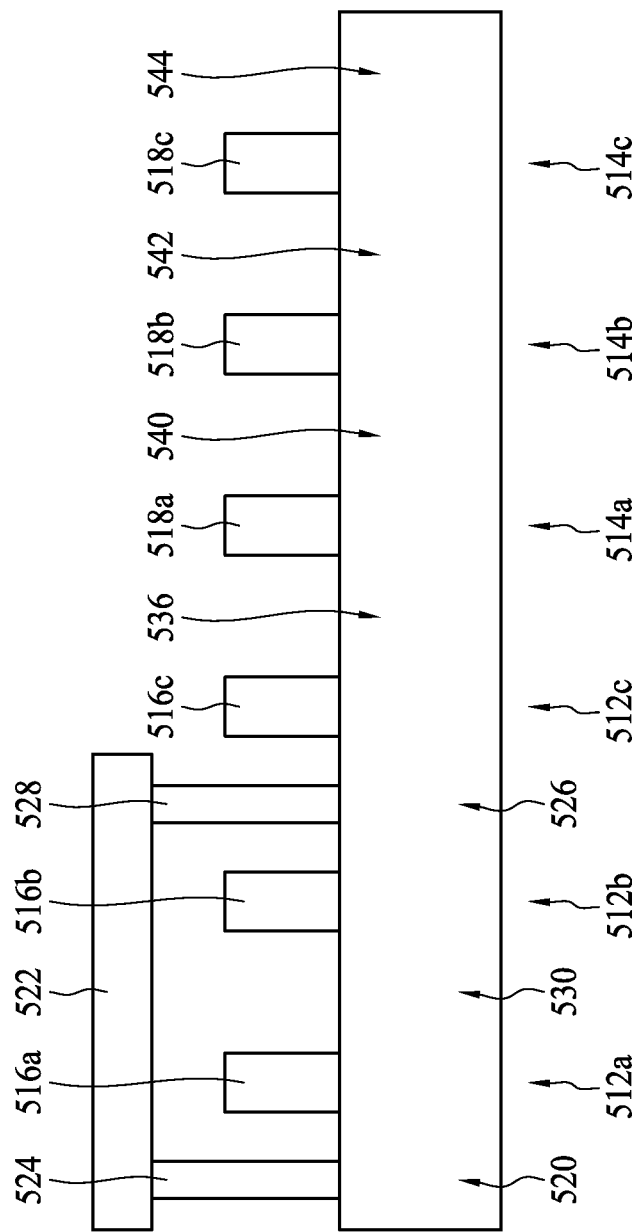
FIG. 15B is a diagram schematically illustrating a cross-section of the semiconductor structure along the line A-A in FIG. 15A, in accordance with some embodiments.

FIG. 15B is a diagram schematically illustrating a cross-section of the transistor stack or semiconductor structure 510 along the line A-A in FIG. 15A, in accordance with some embodiments. The cross-section includes the three parallel connected transistors 512a-512c and the three series connected transistors 514a-514c. Each of the transistors 512a-512c includes a gate 516a-516c, respectively, and each of the transistors 514a-514c includes a gate 518a-518c, respectively. Also, transistors 512a and 512b share drain/source 530, transistors 512b and 512c share drain/source 526, transistors 512c and 514a share drain/source 536, transistors 514a and 514b share drain/source 540, and transistors 514b and 514c share drain/source 542.

Transistor 512a includes the drain/source 520 connected to the VD conductor 522 by via 524. Drain/source 520 is further connected to the drain/source 526 of transistors 512b and 512c through the VD conductor 522 by via 528.

Figure 16:
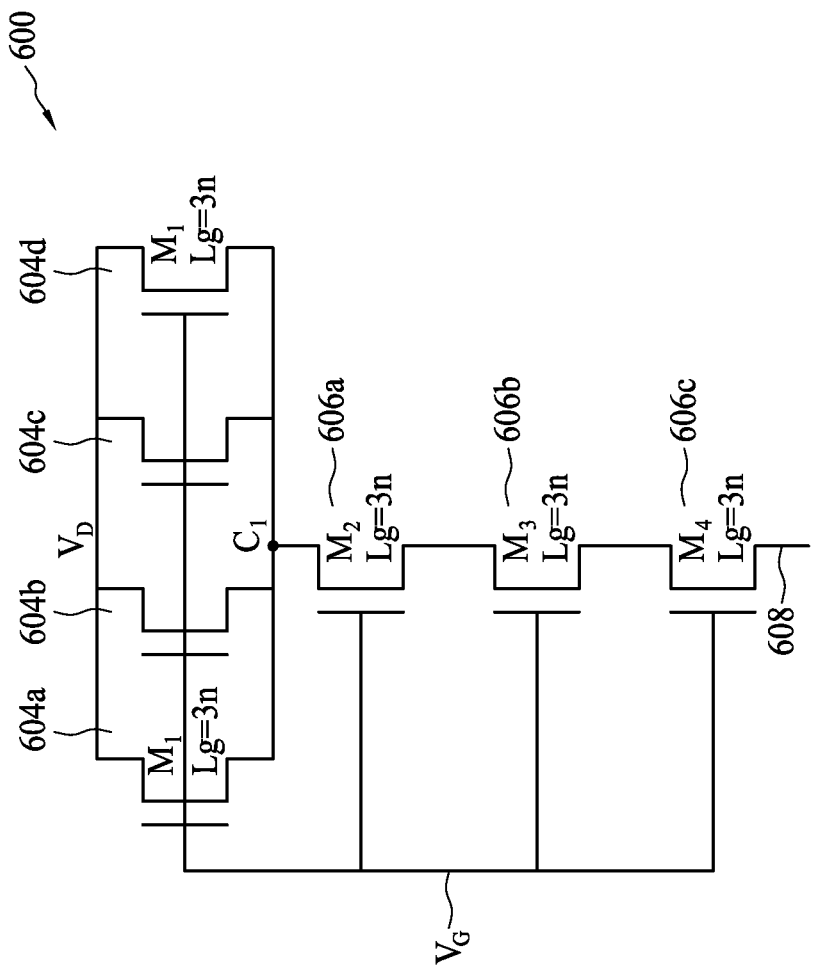
FIG. 16 is a diagram schematically illustrating the V stacked gate cell having P=1 parallel stage of four transistors and N=4 total stages, in accordance with some embodiments.
Figure 17A:
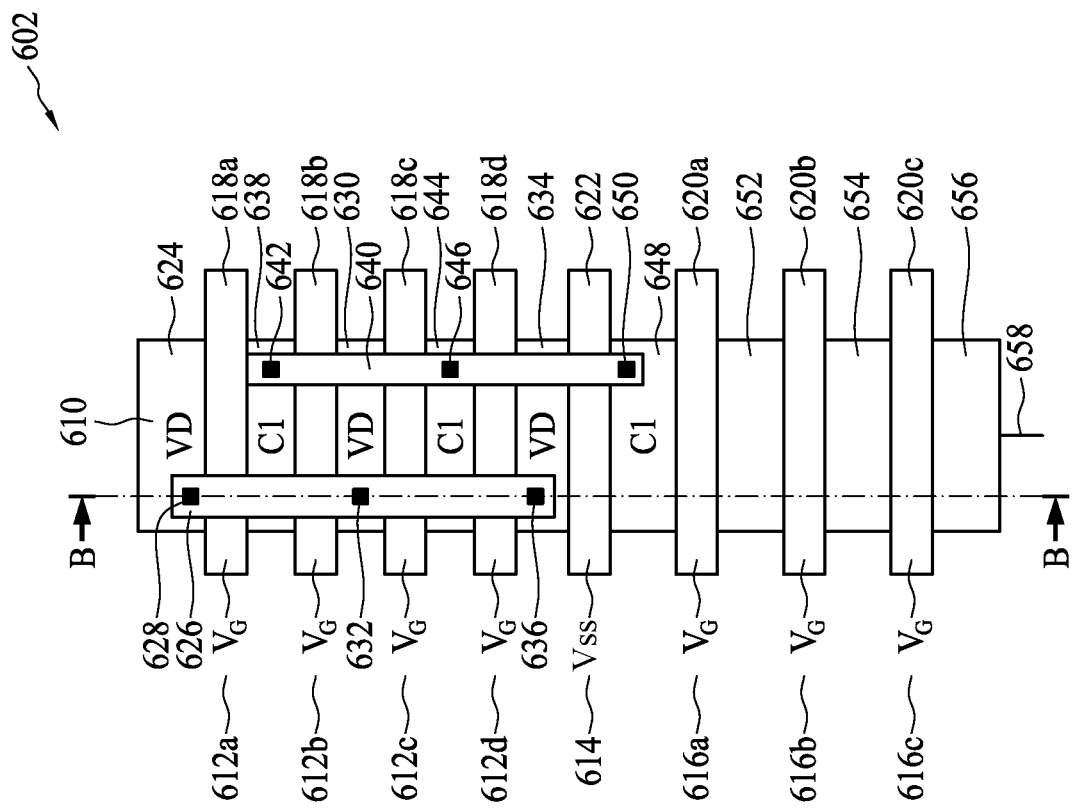
FIG. 17A is a diagram schematically illustrating the V stacked gate cell of FIG. 16, in accordance with some embodiments.

FIGS. 16 and 17A are diagrams schematically illustrating a V stacked gate cell 600 and a semiconductor device 602 of the V stacked gate cell 600, in accordance with some embodiments. FIG. 16 is a diagram schematically illustrating the V stacked gate cell 600 having P=1 parallel stages of four transistors 604a-604d and N=4 total stages, in accordance with some embodiments. FIG. 17A is a diagram schematically illustrating the semiconductor device 602 of the V stacked gate cell 600, in accordance with some embodiments.

The V stacked gate cell 600 includes the four parallel stage transistors 604a-604d and three transistors 606a-606c connected in series to each other and to the four parallel stage transistors 604a-604d. The V stacked gate cell 600 includes transistors 604a-604d connected in parallel, with first drain/source regions of the transistors 604a-604d connected to receive the voltage VD and the second drain/source regions of the transistors 604a-604d connected to each other at C1. Also, the gates of the transistors 604a-604d are connected to receive the gate voltage VG.

The V stacked gate cell 600 further includes the three transistors 606a-606c connected in series with one drain/source of transistor 606a connected to the drain/source regions of the transistors 604a-604d at C1 and the other drain/source of transistor 606a connected to one drain/source of transistor 606b. The other drain/source of transistor 606b is connected to one drain/source of transistor 606c, and the other drain/source of transistor 606c is connected to a connection 608 that can be connected to another cell or to a reference 608, such as ground. The drain/source paths of the transistors 606a-606c are connected in series from the parallel connected transistors 604a-604d to the connection 608. The gates of the transistors 606a-606c are connected to receive gate voltage VG. In some embodiments, the drain/source connections are switched for at least one of the transistors 606a-606c.

Each of the transistors 604a-604d and 606a-606c is an NMOS transistor. In other embodiments, one or more of the transistors 604a-604d and 606a-606c is a PMOS transistor. In some embodiments, the channel length of each of the transistors 604a-604d and 606a-606c is a minimum channel length of the process node. In some embodiments, each of the transistors 604a-604d and 606a-606c has the same channel length or a uniform channel length. In some embodiments, each of the transistors 604a-604d and 606a-606c has a channel length of 3 nm. In some embodiments, at least one of the transistors 604a-604d and 606a-606c has a different channel length, such that the channel lengths of the transistors 604a-604d and 606a-606c are mixed channel lengths.

In the current example, the V stacked gate cell 600 includes four transistors 604a-604d connected in parallel and three transistors 606a-606c connected in series. This results in the design having a total number of transistors of 4+3=7. In some embodiments, the V stacked gate cell 600 was converted from a parallel stacked gate cell having C=4 columns with N=4 transistors in each column, such that the total number of transistors in the parallel stacked gate cell was 4×4=16, with the conversion resulting in a reduction of 9 transistors.

In FIG. 17A, the semiconductor device 602 of the V stacked gate cell 600 includes a transistor stack or semiconductor structure 610 that includes four transistors 612a-612d connected in parallel to each other, one dummy transistor 614, and three transistors 616a-616c connected in series to each other and to the four parallel connected transistors 612a-612d through the dummy transistor 614. The four parallel connected transistors 612a-612d correspond to the four parallel stage transistors 604a-604d, and the three series connected transistors 616a-616c correspond to the three transistors 606a-606c.

Each of the parallel connected transistors 612a-612d includes a gate 618a-618d, respectively, and each of the series connected transistors 616a-616c includes a gate 620a-620c, respectively. The transistor gates 618a-618d and 620a-620c are connected to gate voltage VG. Also, the dummy transistor 614 includes a gate 622 that is connected to a low voltage reference VSS, such as ground, such that the dummy transistor 614 is always off or non-conducting. In some embodiments, each of the transistors 612a-612d, 614, and 616a-616c includes a bulk terminal and all bulk terminals are connected to each other and to a voltage reference value.

Transistor 612a includes a drain/source 624 connected to receive voltage VD and connected to a VD conductor 626 by via 628. Drain/source 624 is further connected to a shared drain/source 630 of transistors 612b and 612c by via 632 through the VD conductor 626, and to a shared drain/source 634 of transistor 612d and dummy transistor 614 by via 636 through the VD conductor 626. Also, transistors 612a and 612b share drain/source 638 that is connected to a C1 conductor 640 by via 642, which is connected to a shared drain/source 644 of transistors 612c and 612d by via 646 through the C1 conductor 640 and to a shared drain/source 648 of dummy transistor 614 and transistor 616a by via 650 through the C1 conductor 640. From there, transistors 616a-616c are connected in series through shared drain/source 652 of transistors 616a and 616b, shared drain/source 654 of transistors 616b and 616c, and drain/source 656 of transistor 616c which is connected to a connection 658 that can be connected to another cell or stack, or connected to a reference, such as ground. The semiconductor device 602 includes a drain/source path from the voltage VD to the connection 658. The total number of transistors (gates) in the semiconductor device 602 is 4+1+3=8, including the dummy transistor 614.

Figure 17B:
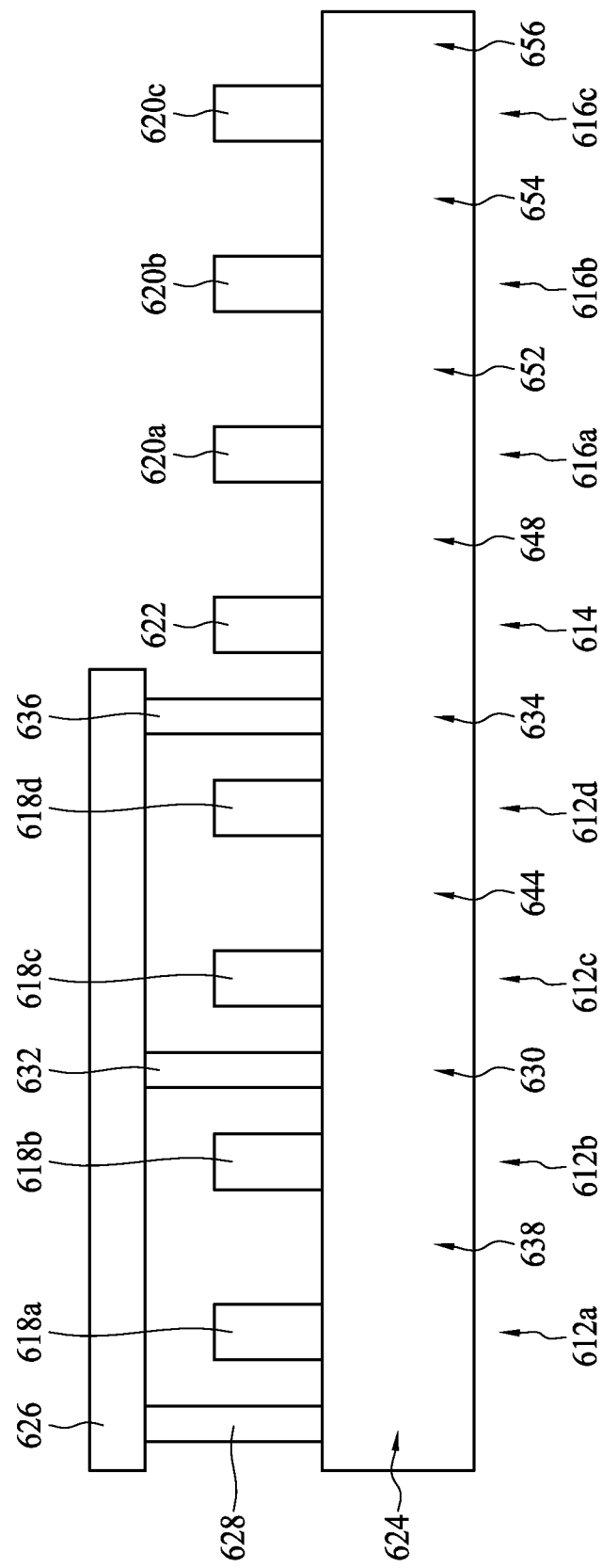
FIG. 17B is a diagram schematically illustrating a cross-section of the semiconductor structure along the line B-B in FIG. 17A, in accordance with some embodiments.

FIG. 17B is a diagram schematically illustrating a cross-section of the transistor stack or semiconductor structure 610 along the line B-B in FIG. 17A, in accordance with some embodiments. The cross-section includes the four transistors 612a-612d, the dummy transistor 614, and the three transistors 616a-616c connected in series to each other and to the four parallel connected transistors 612a-612d through the dummy transistor 614. Each of the parallel connected transistors 612a-612d includes a gate 618a-618d, respectively, and each of the series connected transistors 616a-616c includes a gate 620a-620c, respectively. Also, the dummy transistor 614 includes a gate 622 that is connected to VSS, such that the dummy transistor 614 is always off or non-conducting.

Also, transistors 612a and 612b share drain/source 638, transistors 612b and 612c share drain/source 630, transistors 612c and 612d share drain/source 644, transistors 612d and 614 share drain/source 634, transistors 614 and 616a share drain/source 648, transistors 616a and 616b share drain/source 652, and transistors 616b and 616c share drain/source 654.

Transistor 612a includes a drain/source 624 connected to a VD conductor 626 at via 628. Drain/source 624 is further connected to a shared drain/source 630 of transistors 612b and 612c by via 632 through the VD conductor 626, and to a shared drain/source 634 of transistor 612d and dummy transistor 614 by via 636 through the VD conductor 626.

Figure 18:
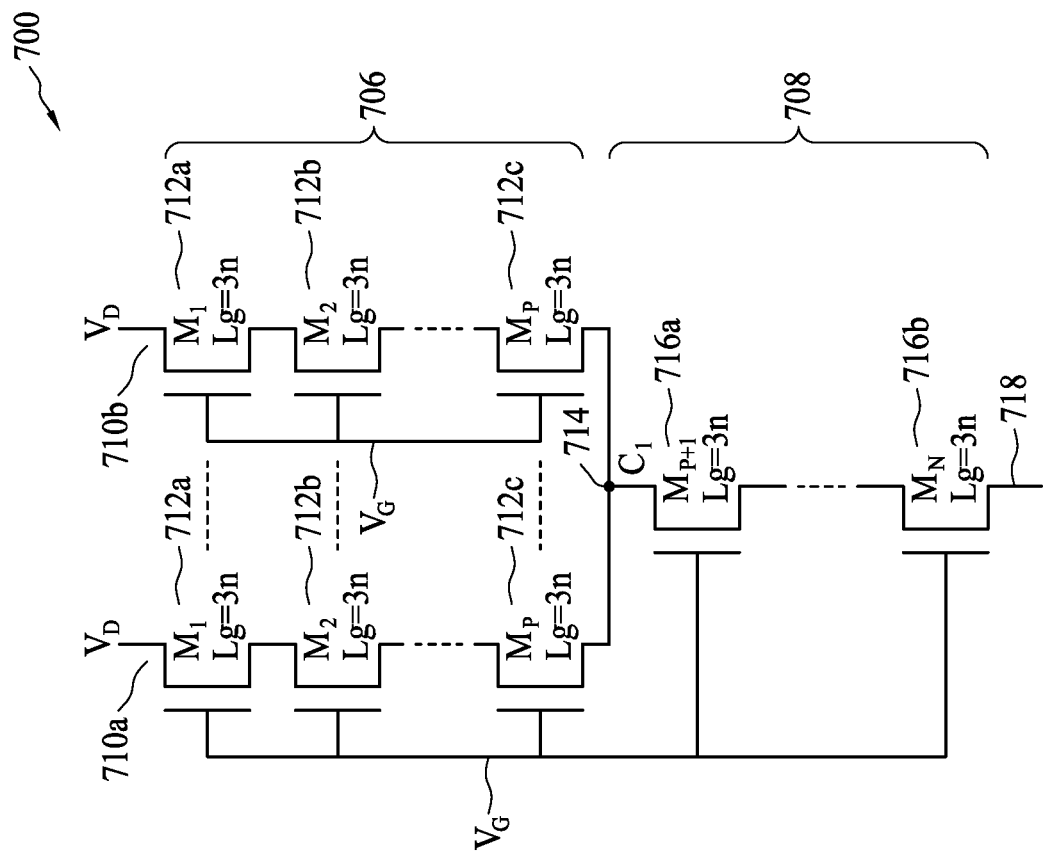
FIG. 18 is a diagram schematically illustrating the V stacked gate cell having C columns of P parallel stages of transistors and N total stages, in accordance with some embodiments.
Figure 19:
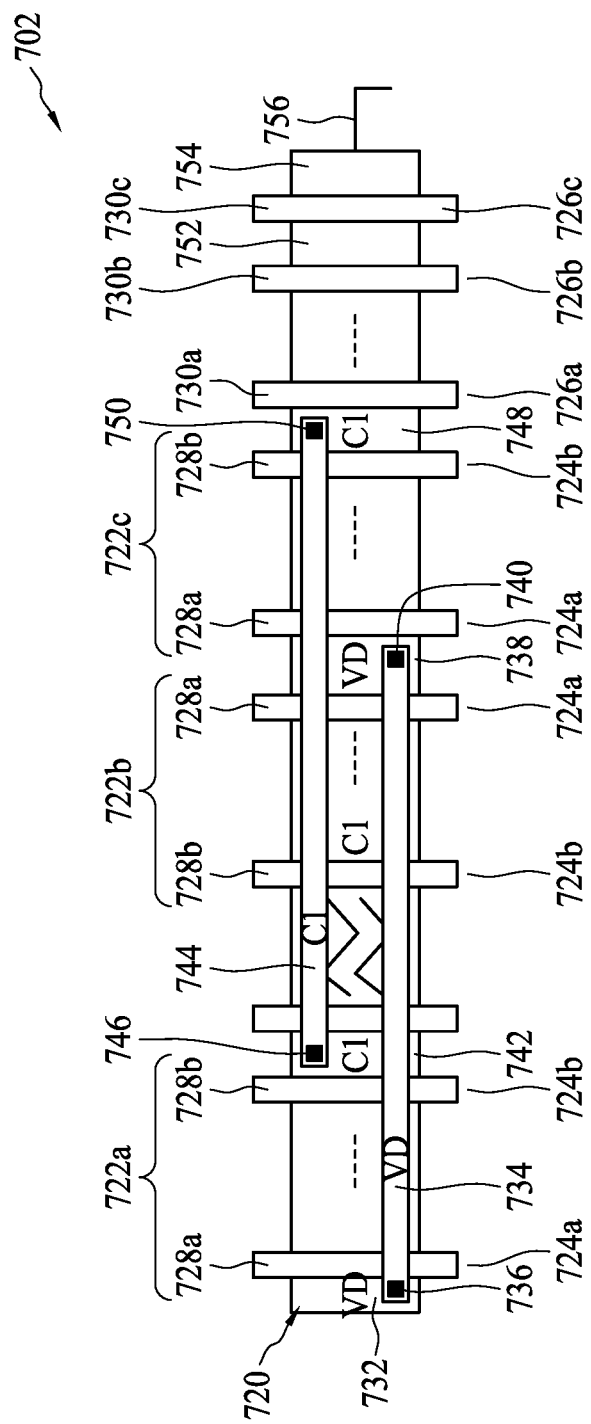
FIG. 19 is a diagram schematically illustrating one version of the V stacked gate cell of FIG. 18, in accordance with some embodiments.
Figure 20:
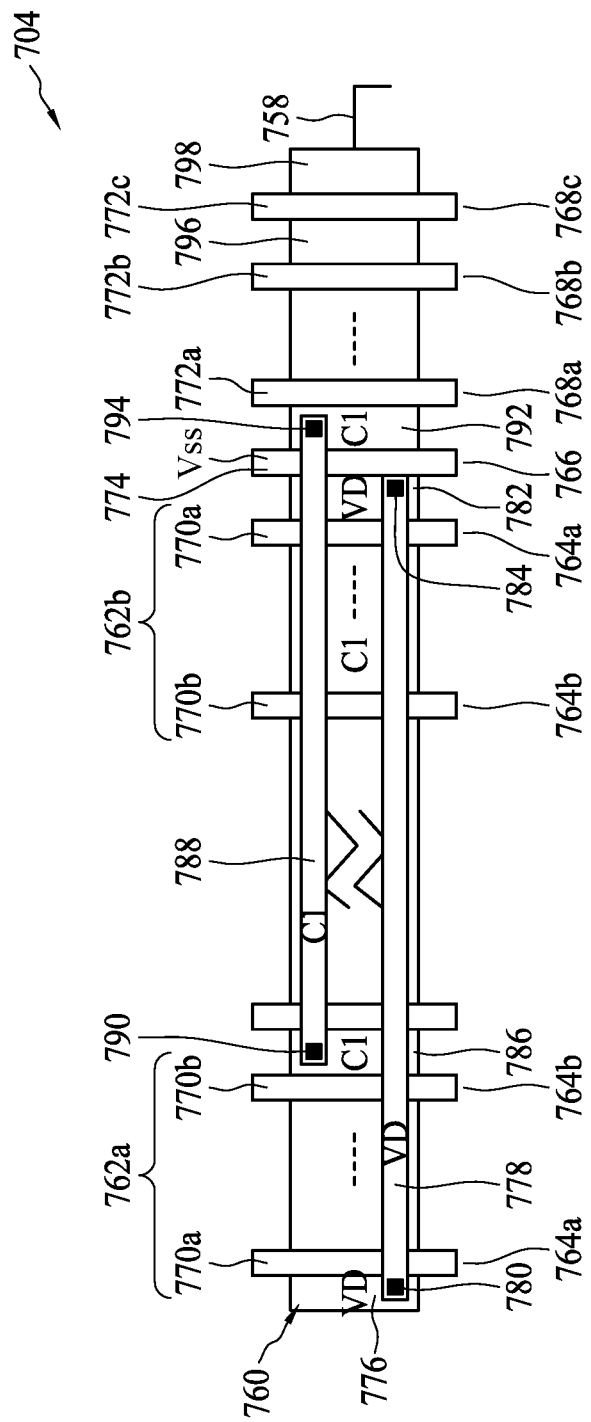
FIG. 20 is a diagram schematically illustrating another version of the V stacked gate cell of FIG. 18, in accordance with some embodiments.

FIGS. 18, 19, and 20 are diagrams schematically illustrating a V stacked gate cell 700, a semiconductor device 702 of the V stacked gate cell 700 including an odd number of parallel branches or columns C, and a semiconductor device 704 of the V stacked gate cell 700 including an even number of parallel branches or columns C, in accordance with some embodiments.

FIG. 18 is a diagram schematically illustrating the V stacked gate cell 700 having C columns of P parallel stages of transistors and N total stages, in accordance with some embodiments. The V stacked gate cell 700 includes a parallel stacked gate cell portion 706 connected in series with a series stacked gate cell portion 708. The parallel stacked gate cell portion 706 includes C columns 710a to 710b of stacked gate cell transistors, where each of the C columns 710a to 710b includes P stages of transistors 712a-712c connected in series with one drain/source of transistor 712a connected to receive the voltage VD and the other drain/source of transistor 712a connected to one drain/source of transistor 712b. The other drain/source of transistor 712b is connected to one drain/source of the next transistor and so on, down to the drain/source of transistor 712c being connected to all the other drain/source regions of the last transistors in the C columns at C1 714. The drain/source paths of the transistors 712a-712c are connected in series from the voltage VD to the drain/source regions of the last transistors in the C columns at C1 714. Also, all gates of the transistors 712a-712c are connected to receive the gate voltage VG. In some embodiments, the drain/source connections are switched for at least one of the transistors 712a-712c.

The series stacked gate cell portion 708 includes transistors 716a to 716b connected in series with one drain/source of transistor 716a connected to the drain/source regions of the last transistors in the C columns at C1 714. The other drain/source of transistor 716a is connected to one drain/source of the next transistor in the series, down to the drain/source of transistor 716b connected to a connection 718 that can be connected to another cell or a reference, such as ground. The number of transistors 716a to 716b in the series stacked gate cell portion 708 is equal to the total number of stages N minus the P stages of transistors 712a-712c in the parallel stacked gate cell portion 706. The drain/source paths of the transistors 716a to 716b are connected in series from the drain/source regions of the last transistors in the C columns at C1 714 to the connection 718. The gates of the transistors 716a to 716b are also connected to gate voltage VG. In some embodiments, the drain/source connections are switched for at least one of the transistors 716a to 716b.

Each of the transistors 712a-712c and 716a to 716b is an NMOS transistor. In other embodiments, one or more of the transistors 712a-712c and 716a to 716b is a PMOS transistor. In some embodiments, the channel length of each of the transistors 712a-712c and 716a to 716b is a minimum channel length of the process node. In some embodiments, each of the transistors 712a-712c and 716a to 716b has the same channel length or a uniform channel length. In some embodiments, each of the transistors 712a-712c and 716a to 716b has a channel length of 3 nm. In some embodiments, at least one of the transistors 712a-712c and 716a to 716b has a different channel length, such that the channel lengths of the transistors 712a-712c and 716a to 716b are mixed channel lengths.

The V stacked gate cell 700 includes the parallel stacked gate cell portion 706 with C columns, where each of the columns includes P stages of transistors, plus the series stacked gate cell portion 708 of N minus P transistors. The number of transistors in the V stacked gate cell 700 is the quantity of C times P plus the quantity of N minus P, i.e., $(C \times P)+(N-P)=T$.

FIG. 19 is a diagram schematically illustrating the semiconductor device 702 of the V stacked gate cell 700, in accordance with some embodiments. The semiconductor device 702 of the V stacked gate cell 700 includes a transistor stack or semiconductor structure 720 that includes an odd number of parallel branches or C columns 722a-722c of P transistors 724a to 724b, and N-P transistors 726a-726c connected in series to each other and to the C columns 722a-722c. Each of the C columns 722a-722c includes the P transistors 724a to 724b connected in series to provide a drain/source path in parallel with the other C columns 722a-722c. Each of the series connected transistors 724a to 724b in the C columns 722a-722c includes a gate 728a to 728b, respectively, and each of the N-P transistors 726a-726c includes a gate 730a-730c, respectively. All the transistor gates 728a to 728b and 730a-730c are connected to gate voltage VG. In some embodiments, each of the series connected transistors 724a to 724b in the C columns 722a-722c and each of the N-P transistors 726a-726c includes a bulk terminal and all bulk terminals are connected to each other and to a voltage reference value.

The first transistor 724a of column 722a includes a drain/source 732 connected to receive voltage VD and connected to a VD conductor 734 by via 736. Drain/source 732 is further connected to other VD connected drain/source regions of the C columns 722a to 722b including drain/source 738 of transistor 724a of column 722b and transistor 724a of column 722c through the VD conductor 734 by via 740. Also, transistors 724b of column 722a and transistor 724b of the next column share drain/source 742 that is connected to a C1 conductor 744 by via 746, which is connected to other C1 connected drain/source regions of the C columns 722a to 722b including shared drain/source 748 of transistors 724b of column 722c and 726a through C1 conductor 744 by via 750. From there, transistors 726a-726c are connected in series down to shared drain/source 752 of transistors 726b and 726c, and drain/source 754 of transistor 726c connected to a connection 756 that can be connected to another cell or stack or device, or connected to a reference, such as ground. The semiconductor device 702 includes a drain/source path from the voltage VD to the connection 756. The total number of transistors in the semiconductor device 702 is $(C \times P)+(N-P)$.

FIG. 20 is a diagram schematically illustrating the semiconductor device 704 of the V stacked gate cell 700, in accordance with some embodiments. The semiconductor device 704 of the V stacked gate cell 700 includes a transistor stack or semiconductor structure 760 that includes an even number of parallel branches or C columns 762a to 762b each including P transistors 764a to 764b, a dummy transistor 766, and N-P transistors 768a-768c connected in series to each other and to the C columns 762a to 762b through the dummy transistor 766. Each of the C columns 762a to 762b includes the P transistors 764a to 764b connected in series to provide a drain/source path in parallel with the other C columns 762a to 762b. The C columns 762a to 762b correspond to the C columns 710a to 710b shown in FIG. 18, and the N-P transistors 768a-768c correspond to the transistors 716a to 716b shown in FIG. 18.

Each of the P transistors 764a to 764b in the C columns 762a-762c includes a gate 770a to 770b, respectively, and each of the N-P transistors 768a-768c includes a gate 772a-772c, respectively. All the transistor gates 770a to 770b and 772a-772c are connected to gate voltage VG. Also, the dummy transistor 766 includes a gate 774 that is connected to a low voltage reference VSS, such as ground, such that the dummy transistor 766 is always off or non-conducting. In some embodiments, each of the P transistors 764a to 764b in the C columns 762a-762c, the dummy transistor 766, and each of the N-P transistors 768a-768c includes a bulk terminal and all bulk terminals are connected to each other and to a voltage reference value.

The first transistor 764a of column 762a includes a drain/source 776 connected to receive voltage VD and connected to a VD conductor 778 by via 780. Drain/source 776 is further connected to other VD connected drain/source regions of the C columns 762a to 762b including drain/source 782 of transistor 764a of column 762b and of dummy transistor 766 through the VD conductor 778 by via 784. Also, transistors 764b of column 762a and transistor 764b of the next column share drain/source 786 that is connected to C1 conductor 788 by via 790, which is connected to other drain/source regions of the C columns including shared drain/source 792 of dummy transistor 766 and transistor 768a through the C1 conductor 788 by via 794. From there, transistors 768a-768c are connected in series down to shared drain/source 796 of transistors 768b and 768c, and drain/source 798 of transistor 768c connected to a connection 758 that can be connected to another cell or stack or device, or connected to a reference, such as ground. The semiconductor device 704 includes a drain/source path from the voltage VD to the connection 758. The total number of transistors in the semiconductor device 704 is $(C \times P)+1+(N-P)$.

Figure 21:
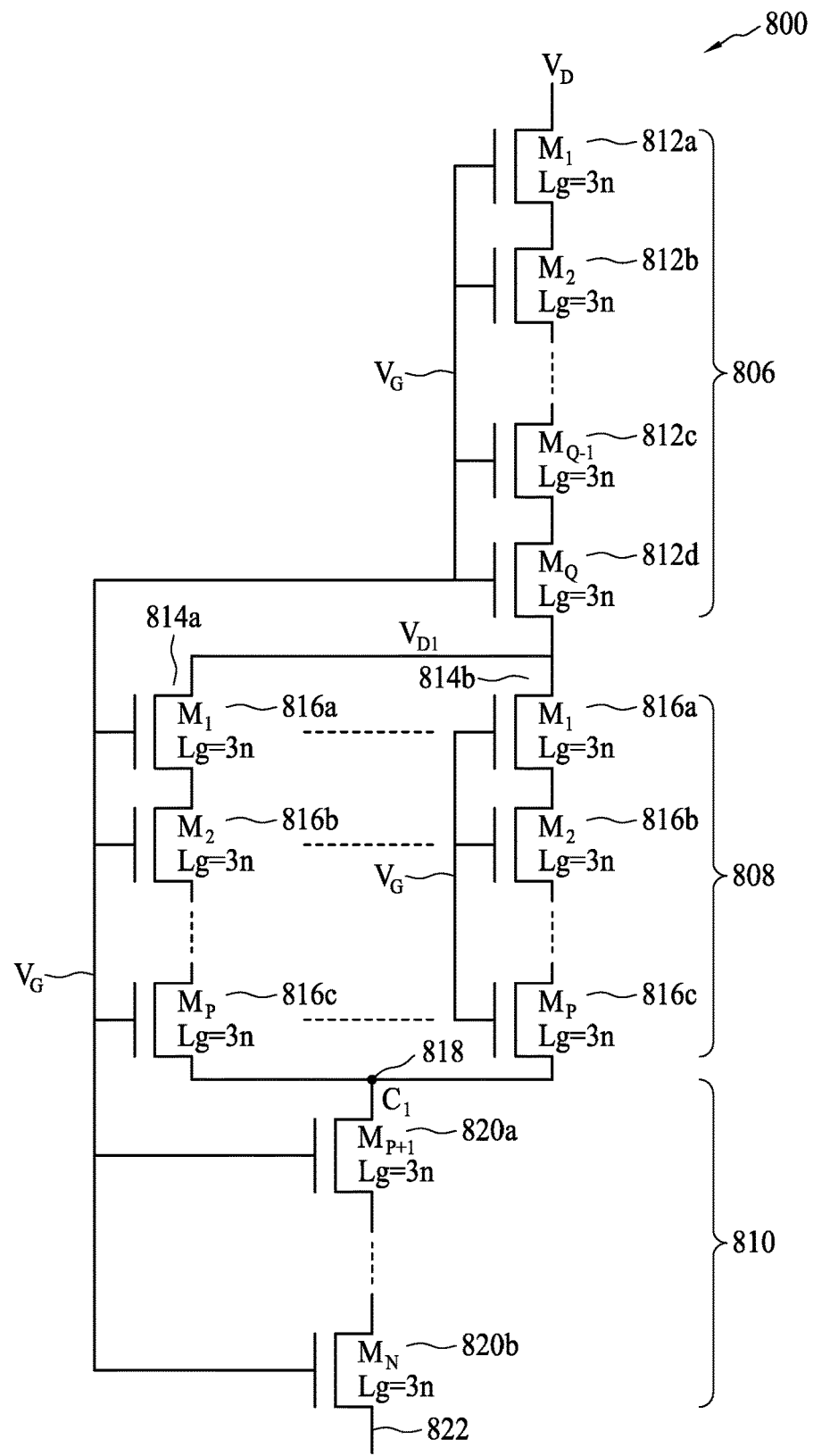
FIG. 21 is a diagram schematically illustrating the V stacked gate cell having a first series stacked gate cell portion, a parallel stacked gate cell portion, and a second series stacked gate cell portion, in accordance with some embodiments.
Figure 22:
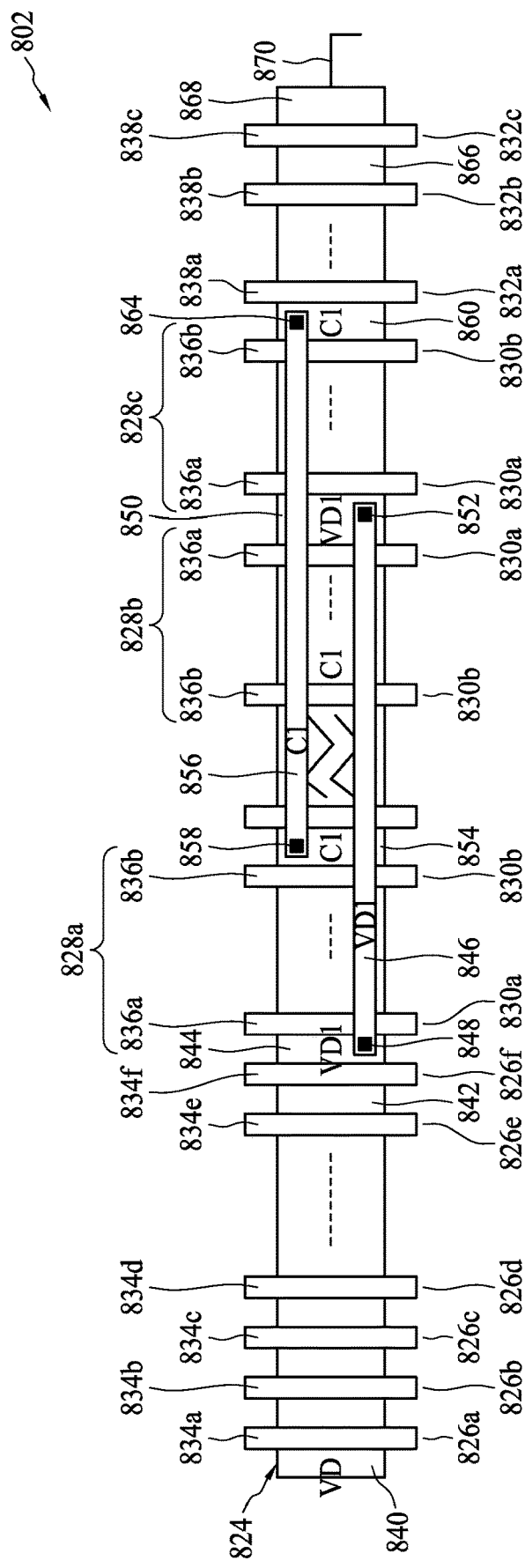
FIG. 22 is a diagram schematically illustrating the V stacked gate cell of FIG. 21 including an odd number of parallel branches or columns C, in accordance with some embodiments.
Figure 23:
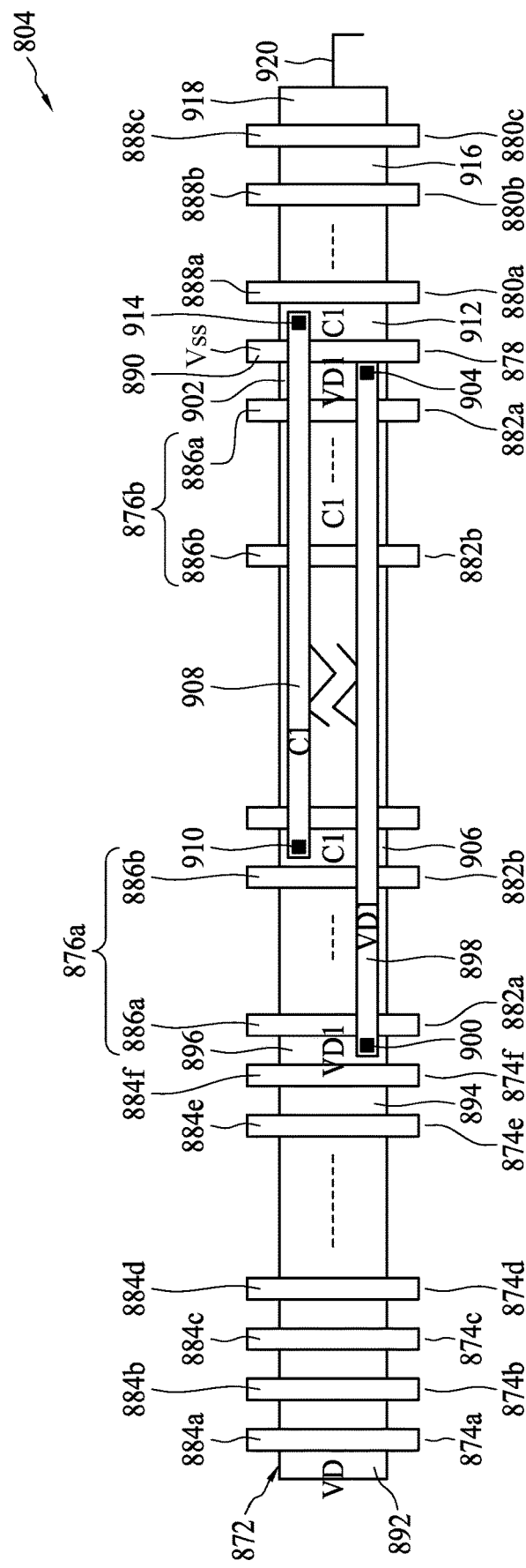
FIG. 23 is a diagram schematically illustrating the V stacked gate cell of FIG. 21 including an even number of parallel branches or columns C, in accordance with some embodiments.

FIGS. 21, 22, and 23 are diagrams illustrating a V stacked gate cell 800, a semiconductor device 802 of the V stacked gate cell 800 including an odd number of parallel branches or columns C, and a semiconductor device 804 of the V stacked gate cell 800 including an even number of parallel branches or columns C, in accordance with some embodiments.

FIG. 21 is a diagram schematically illustrating the V stacked gate cell 800 having a first series stacked gate cell portion 806, a parallel stacked gate cell portion 808, and a second series stacked gate cell portion 810, in accordance with some embodiments. The V stacked gate cell 800 includes the first series stacked gate cell portion 806 connected in series with the parallel stacked gate cell portion 808, which is connected in series with the second series stacked gate cell portion 810.

The first series stacked gate cell portion 806 includes Q stages of transistors 812a-812d connected in series with one drain/source of transistor 812a connected to the voltage VD and the other drain/source of transistor 812a connected to one drain/source of transistor 812b. The other drain/source of transistor 812b is connected to the next transistor in the series, down to the drain/source of transistor 812d connected to drain/source regions of the parallel stacked gate cell portion 808. The number of transistors 812a-812d in the first series stacked gate cell portion 806 is equal to Q. The drain/source paths of the transistors 812a-812d are connected in series from the voltage VD to the drain/source regions of the parallel stacked gate cell portion 808. The gates of the transistors 812a-812d are connected to gate voltage VG. In some embodiments, the drain/source connections are switched for at least one of the transistors 812a-812d.

The parallel stacked gate cell portion 808 includes C columns 814a to 814b of stacked gate cell transistors, where each of the C columns 814a to 814b includes P stages of transistors 816a-816c connected in series with one drain/source of transistor 816a connected to the drain/source of transistor 812d to receive the voltage VD1 and the other drain/source of transistor 816a connected to one drain/source of transistor 816b. The other drain/source of transistor 816b is connected to the drain/source of the next transistor and so on, down to the drain/source of transistor 816c connected to all the other drain/source regions of the last transistors in the C columns at C1 818. The drain/source paths of the transistors 816a-816c are connected in series from the voltage VD1 to the drain/source regions of the last transistors in the C columns at C1 818. Also, all gates of the transistors 816a-816c are connected to receive the gate voltage VG. In some embodiments, the drain/source connections are switched for at least one of the transistors 816a-816c.

The second series stacked gate cell portion 810 includes transistors 820a to 820b connected in series with one drain/source of transistor 820a connected to the drain/source regions of the last transistors in the C columns at C1 818. The other drain/source of transistor 820a is connected to the drain/source of the next transistor in the series, down to the drain/source of transistor 820b connected to a connection 822 that can be connected to another cell or a reference, such as ground. The number of transistors 820a to 820b in the second series stacked gate cell portion 810 is equal to the number of stages N in the stacked gate cell portions 808 and 810 minus the P stages of transistors 816a-816c in the parallel stacked gate cell portion 808. The drain/source paths of the transistors 820a to 820b are connected in series from the drain/source regions of the last transistors in the C columns at C1 818 to the connection 822. The gates of the transistors 820a to 820b are also connected to gate voltage VG. In some embodiments, the drain/source connections are switched for at least one of the transistors 820a to 820b.

Each of the transistors 812a-812d, 816a-816c, and 820a to 820b is an NMOS transistor. In other embodiments, one or more of the transistors 812a-812d, 816a-816c, and 820a to 820b is a PMOS transistor. In some embodiments, the channel length of each of the transistors 812a-812d, 816a-816c, and 820a to 820b is a minimum channel length of the process node. In some embodiments, each of the transistors 812a-812d, 816a-816c, and 820a to 820b has the same channel length or a uniform channel length. In some embodiments, each of the transistors 812a-812d, 816a-816c, and 820a to 820b has a channel length of 3 nm. In some embodiments, at least one of the transistors 812a-812d, 816a-816c, and 820a to 820b has a different channel length, such that the channel lengths of the transistors 812a-812d, 816a-816c, and 820a to 820b are mixed channel lengths.

The V stacked gate cell 800 includes the first series stacked gate cell portion 806 that includes Q transistors, the parallel stacked gate cell portion 808 that includes C columns with each of the C columns including P stages of transistors, and the second series stacked gate cell portion 810 that includes N minus P transistors. Thus, the number of transistors in the V stacked gate cell 800 is Q plus the quantity of C times P plus the quantity of N minus P, i.e., Q+(C×P)+(N−P)=T.

FIG. 22 is a diagram schematically illustrating the semiconductor device 802 of the V stacked gate cell 800 including an odd number of parallel branches or columns C, in accordance with some embodiments. The semiconductor device 802 includes a transistor stack or semiconductor structure 824 that includes Q transistors 826a-826f connected in series to each other and to the odd number of C columns 828a-828c, and N-P transistors 832a-832c connected in series to each other and to the odd number of C columns 828a-828c. Each of the C columns 828a-828c includes P transistors 830a to 830b connected in series to provide a drain/source path in parallel with the other C columns 828a-828c.

Each of the Q transistors 826a-826f includes a gate 834a-834f, respectively, each of the P series connected transistors 830a to 830b in the C columns 828a-828c includes a gate 836a to 836b, respectively, and each of the N-P transistors 832a-832c includes a gate 838a-838c, respectively. All the transistor gates 834a-834f, 836a to 836b, and 838a-838c are connected to gate voltage VG. In some embodiments, each of the Q transistors 826a-826f, P transistors 830a to 830b of the C columns 828a-828c, and N-P transistors 832a-832c includes a bulk terminal and all bulk terminals are connected to each other and to a voltage reference value.

The Q transistors 826a-826f are connected in series from drain/source 840 of transistor 826a that is connected to receive voltage VD, down to drain/source 842 of transistors 826e and 826f and shared drain/source 844 of transistor 826f and the transistors 830a of the C columns 828a-828c. The shared drain/source 844 receives voltage VD1 and is connected to a VD1 conductor 846 by via 848. Drain/source 844 is further connected to other VD1 connected drain/source regions of the C columns 828a-828c including drain/source 850 of transistor 830a of column 828b and transistor 830a of column 828c through the VD1 conductor 846 by via 852. Also, transistor 830b of column 828a and the next transistor share drain/source 854 that is connected to a C1 conductor 856 by via 858, which is connected to other drain/source regions of the C columns 828a-828c including shared drain/source 860 of transistor 830b of column 828c and transistor 832a through C1 conductor 856 by via 864. From there, transistors 832a-832c are connected in series down to shared drain/source 866 of transistors 832b and 832c, and drain/source 868 of transistor 832c which is connected to a connection 870 that can be connected to another cell or stack or device, or connected to a reference, such as ground. The semiconductor device 802 includes a drain/source path from the voltage VD to the connection 870. The total number of transistors in the semiconductor device 802 is Q+(C×P)+(N−P).

FIG. 23 is a diagram schematically illustrating the semiconductor device 804 of the V stacked gate cell 800 including an even number of parallel branches or columns C, in accordance with some embodiments. The semiconductor device 804 includes a transistor stack or semiconductor structure 872 that includes Q transistors 874a-874f connected in series to each other and to the even number of C columns 876a to 876b, a dummy transistor 878, and N-P transistors 880a-880c connected in series to each other and to the C columns 876a to 876b through the dummy transistor 878. Each of the C columns 876a to 876b includes P transistors 882a to 882b connected in series to provide a drain/source path in parallel with the other C columns 876a to 876b. The C columns 876a to 876b correspond to the C columns 814a to 814b shown in FIG. 21, and the N-P transistors 880a-880c correspond to the transistors 820a to 820b shown in FIG. 21.

Each of the Q transistors 874a-874f includes a gate 884a-884f, respectively, each of the P series connected transistors 882a to 882b in the C columns 876a to 876b includes a gate 886a to 886b, respectively, and each of the N-P transistors 880a-880c includes a gate 888a-888c, respectively. All the transistor gates 884a-884f, 886a to 886b, and 888a-888c are connected to gate voltage VG. Also, the dummy transistor 878 includes a gate 890 that is connected to a low voltage reference VSS, such as ground, such that the dummy transistor 878 is always off or non-conducting. In some embodiments, each of the Q transistors 874a-874f, P transistors 882a to 882b of the C columns 876a to 876b, the dummy transistor 878, and the N-P transistors 880a-880c includes a bulk terminal and all bulk terminals are connected to each other and to a voltage reference value.

The Q transistors 874a-874f are connected in series from drain/source 892 of transistor 874a that is connected to receive voltage VD, down to drain/source 894 of transistors 874e and 874f and shared drain/source 896 of transistor 874f and the first transistors 882a of the C columns 876a to 876b. The shared drain/source 896 receives voltage VD1 and is connected to a VD1 conductor 898 by via 900. Drain/source 896 is further connected to other VD1 connected drain/source regions of the C columns 876a to 876b including drain/source 902 of transistor 882a of column 876b and of dummy transistor 878 through the VD1 conductor 898 by via 904.

Also, transistors 882b of column 876a and transistor 882b of the next column share drain/source 906 that is connected to C1 conductor 908 by via 910, which is connected to other drain/source regions of the C columns including shared drain/source 912 of dummy transistor 878 and transistor 880a through the C1 conductor 908 by via 914. From there, transistors 880a-880c are connected in series down to shared drain/source 916 of transistors 880b and 880c, and drain/source 918 of transistor 880c connected to a connection 920 that can be connected to another cell or stack or device, or connected to a reference, such as ground. The semiconductor device 804 includes a drain/source path from the voltage VD to the connection 920. The total number of transistors in the semiconductor device 804 is Q+(C×P)+1+(N−P).

Figure 24:
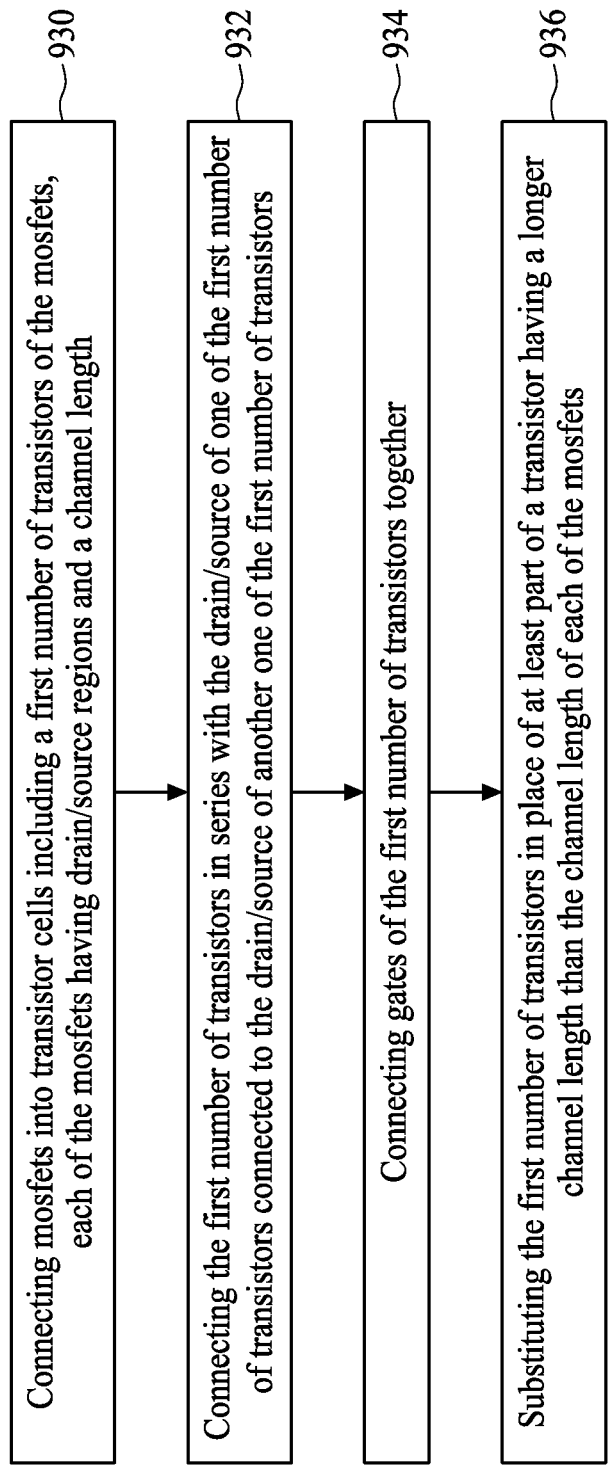
FIG. 24 is a diagram schematically illustrating a method of replacing at least a portion of a longer channel transistor with shorter channel transistors, in accordance with some embodiments.

FIG. 24 is a diagram schematically illustrating a method of replacing at least a portion of a longer channel transistor with shorter channel transistors, in accordance with some embodiments.

At 930, the method includes connecting mosfets into transistor cells including a first number of transistors of the mosfets, each of the mosfets having drain/source regions and a channel length. In some embodiments, the method includes connecting at least two of the transistor cells in series. In some embodiments, the method includes connecting at least two of the transistor cells in parallel.

At 932, the method includes connecting the first number of transistors in series with the drain/source of one of the first number of transistors connected to the drain/source of another one of the first number of transistors and, at 934, the method includes connecting gates of the first number of transistors together.

At 936, the method includes substituting the first number of transistors in place of at least part of a transistor having a longer channel length than the channel length of each of the mosfets.

In some embodiments, the method further includes each of the transistor cells including a second number of transistors of the mosfets, and connecting the second number of transistors in parallel with one drain/source of one of the second number of transistors connected to one drain/source of another one of the second number of transistors, and the other drain/source of the one of the second number of transistors connected to the other drain/source of the other one of the second number of transistors.

Figure 25:
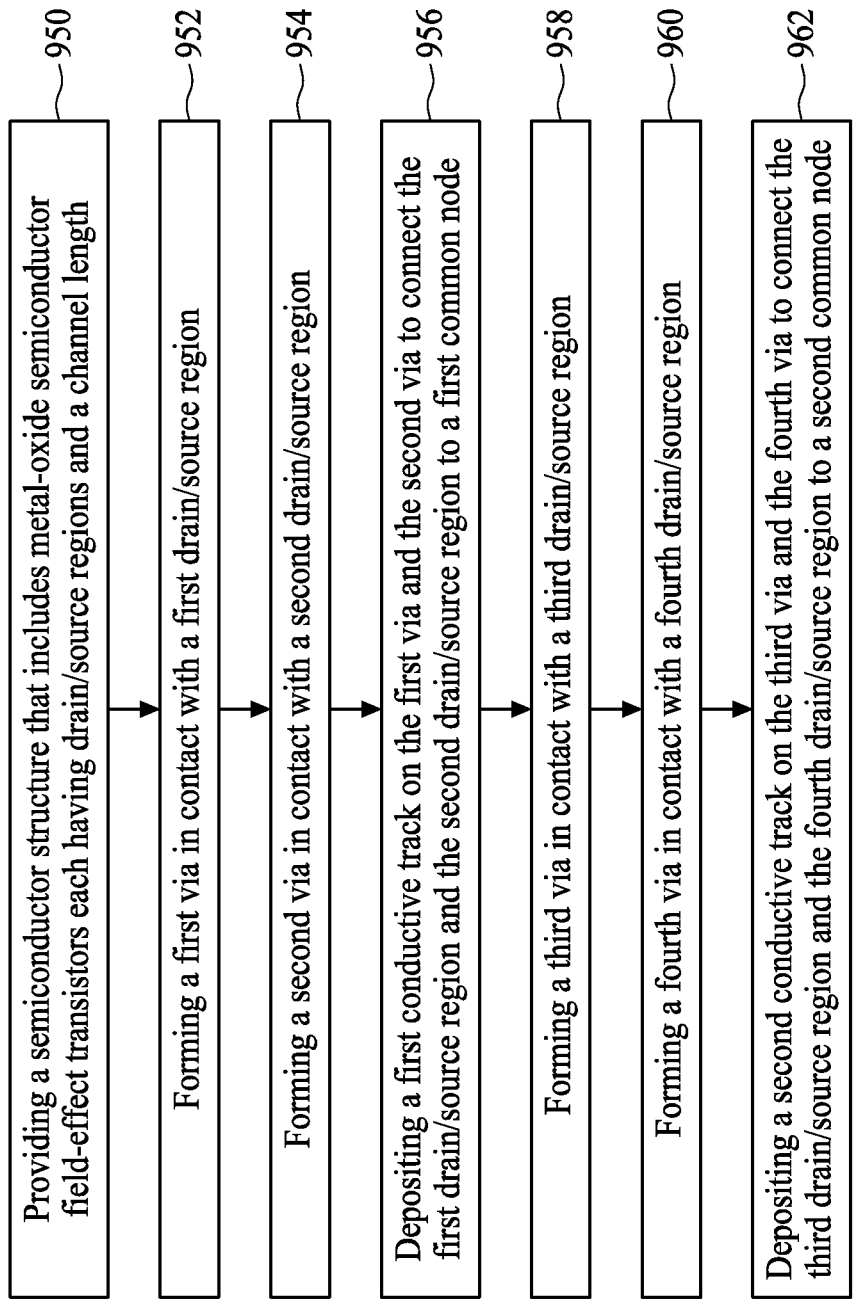
FIG. 25 is a diagram schematically illustrating a method of manufacturing an integrated circuit, in accordance with some embodiments.

FIG. 25 is a diagram schematically illustrating a method of manufacturing an integrated circuit, in accordance with some embodiments. At 950, the method includes providing a semiconductor structure that includes mosfets each having drain/source regions and a channel length. In some embodiments, the semiconductor structure is one of the semiconductor structures 510, 610, 720, 760, 824, and 872 shown in FIGS. 15, 17, 19, 20, 22, and 23, respectively. Also, the description that follows applies to each of the semiconductor structures 510, 610, 720, 760, 824, and 872, however, for convenience and clarity, a limited number of the components are referred to in the following description.

At 952, the method includes forming a first via, such as via 524, in contact with a first drain/source region, such as drain/source region 520 and, at 954, the method includes forming a second via, such as via 528, in contact with a second drain/source region, such as drain/source region 526. At 956, the method includes depositing a first conductive track, such as VD conductor 522, on the first via and the second via to connect the first drain/source region and the second drain/source region to a first common node, such as a VD node to receive the voltage VD.

At 958, the method includes forming a third via, such as via 534, in contact with a third drain/source region, such as drain/source region 530 and, at 960, the method includes forming a fourth via, such as via 538, in contact with a fourth drain/source region, such as drain/source region 536. At 962, the method includes depositing a second conductive track, such as C1 conductor 532, on the third via and the fourth via to connect the third drain/source region and the fourth drain/source region to a second common node, such as the C1 node. Where, the connected mosfets provide a longer channel length than the channel length of each of the mosfets.

In some embodiments, the method includes wherein the fourth drain/source region at the second common node is shared between a first mosfet, such as transistor 512c, and a second mosfet, such as transistor 514a, that shares a fifth drain/source region, such as drain/source region 540, with a third mosfet, such as transistor 514b, in series with the second mosfet.

In some embodiments, the method includes wherein the first drain/source region, such as drain/source region 844 shown in FIG. 22, at the first common node, such as VD1 in FIG. 22, is shared between a first mosfet, such as transistor 830a, and a second mosfet, such as transistor 826f, that shares a fifth drain/source region, such as drain/source region 842, with a third mosfet, such as transistor 826e, in series with the second mosfet.

Disclosed embodiments thus provide transistor cells for newer process nodes, which can be used to replace devices of previous process nodes. The transistor cells can be used to replace longer channel length devices and/or higher voltage devices of the previous process nodes. In some embodiments, the transistor cells can be treated as new higher voltage devices and/or new longer channel length devices in a macro model for modeling circuit designs. In some embodiments, the transistor cells can be used in design tools and in a design flow that includes automatic porting and/or automatic generation tools, such that the design flow uses the transistor cells in porting a database from a previous process node to the newer process node with less new device definition and/or less updating of the design flow.

Disclosed embodiments are directed to a device that includes transistor cells that include mosfets, where each of the transistor cells includes a first number of transistors connected in series and the gates of the first number of transistors connected. Also, disclosed embodiments further include V stacked gate configurations that include transistors connected in series and transistors connected in parallel, where the V stacked gate configurations use fewer transistors. In some embodiments, at least two of the transistor cells have drain/source paths connected in series and, in some embodiments, at least two of the transistor cells have drain/source paths connected in parallel.

The disclosed transistor cells make it easier for a design team to define a target device at the new process node. In addition, the transistor cells improve portability of a circuit design from a previous process node to a newer process node. In some embodiments, replacing the higher voltage devices and/or the longer channel length devices of the previous process node with the transistor cells results in die shrinkage that is greater than 50%. Also, in some embodiments, the V stack gate architecture uses fewer transistors and has smaller parasitic capacitance values, resulting in speed improvements of greater than 10%.

In accordance with some embodiments, a device includes at least one transistor cell including metal-oxide semiconductor field-effect transistors each having drain/source terminals and a channel length. The at least one transistor cell includes a first number of transistors of the metal-oxide semiconductor field-effect transistors connected in series, with one of the drain/source terminals of one of the first number of transistors connected to one of the drain/source terminals of another one of the first number of transistors and gates of the first number of transistors connected together. The at least one transistor cell configured to be used to provide a transistor having a longer channel length than the channel length of each of the metal-oxide semiconductor field-effect transistors.

In accordance with further embodiments, an integrated circuit includes a first semiconductor structure including a first number of transistors of a plurality of metal-oxide semiconductor field-effect transistors each having a channel length. The first number of transistors have drain/source paths in series and are arranged to provide an equivalent transistor function having a longer channel length than the channel length of each of the plurality of metal-oxide semiconductor field-effect transistors.

In accordance with still further disclosed aspects, a method of manufacturing an integrated circuit includes: providing a semiconductor structure that includes metal-oxide semiconductor field-effect transistors each having drain/source regions and a channel length; forming a first via in contact with a first drain/source region; forming a second via in contact with a second drain/source region; depositing a first conductive track on the first via and the second via to connect the first drain/source region and the second drain/source region to a first common node; forming a third via in contact with a third drain/source region; forming a fourth via in contact with a fourth drain/source region; depositing a second conductive track on the third via and the fourth via to connect the third drain/source region and the fourth drain/source region to a second common node, wherein the connected metal-oxide semiconductor field-effect transistors provide a longer channel length than the channel length of each of the metal-oxide semiconductor field-effect transistors.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
at least one transistor cell including metal-oxide semiconductor field-effect transistors each having drain/source terminals and a channel length;
wherein the at least one transistor cell includes a first number of transistors of the metal-oxide semiconductor field-effect transistors connected in series with a first one of the drain/source terminals of a first one of the first number of transistors connected to a first one of the drain/source terminals of a second one of the first number of transistors and gates of the first number of transistors connected together, and a second number of transistors of the metal-oxide semiconductor field-effect transistors connected in parallel to each other with a first one of the drain/source terminals of a first one of the second number of transistors connected to a first one of the drain/source terminals of a second one of the second number of transistors, and a second one of the drain/source terminals of the first one of the second number of transistors connected to a second one of the drain/source terminals of the second one of the second number of transistors and gates of the second number of transistors connected together, the at least one transistor cell configured to be used to provide a transistor having a longer channel length than the channel length of each of the metal-oxide semiconductor field-effect transistors.

2. The device of claim 1, wherein the at least one transistor cell includes at least two transistor cells that have drain/source paths connected in series.

3. The device of claim 1, wherein the at least one transistor cell includes at least two transistor cells that have drain/source paths connected in parallel.

4. The device of claim 1, wherein the at least one transistor cell includes at least two transistor cells that have drain/source paths connected in series and the at least one transistor cell includes at least two other transistor cells that have drain/source paths connected in parallel.

5. The device of claim 1, wherein a process design kit includes a kit cell of the at least one transistor cell.

6. The device of claim 1, wherein a macro model is configured to model the at least one transistor cell and includes at least one of a layout pattern, a layout versus schematic, and design rule checking based on the at least one transistor cell.

7. The device of claim 1, wherein the at least one transistor cell includes at least two transistor cells that have drain/source paths connected in series and each of the at least two transistor cells is connected to a different gate voltage.

8. The device of claim 1, wherein the first one of the drain/source terminals of the first one of the second number of transistors is connected to power.

9. The device of claim 1, wherein each of the first number of transistors includes a bulk terminal and all bulk terminals in the first number of transistors are connected to each other.

10. The device of claim 1, wherein at least one channel length of the metal-oxide semiconductor field-effect transistors in the first number of transistors is different from at least one other channel length of the metal-oxide semiconductor field-effect transistors in the first number of the transistors.

11. The device of claim 1, wherein a second one of the drain/source terminals of the second one of the first number of transistors is connected to another device or to a reference voltage.

12. An integrated circuit, comprising:
a first semiconductor structure including a first number of transistors of a plurality of metal-oxide semiconductor field-effect transistors each having a channel length, the first number of transistors having first drain/source paths connected in series and arranged to provide an equivalent transistor function having a longer channel length than the channel length of each of the plurality of metal-oxide semiconductor field-effect transistors, the first semiconductor structure including a second number of transistors of the plurality of metal-oxide semiconductor field-effect transistors, a first one of the second number of transistors including a first drain/source terminal connected to a first drain/source terminal of a second one of the second number of transistors and the first one of the second number of transistors including a second drain/source terminal connected to a second drain/source terminal of the second one of the second number of transistors to provide a parallel combination of the first one of the second number of transistors and the second one of the second number of transistors, wherein the first number of transistors is connected in series with the parallel combination of the second number of transistors.

13. The integrated circuit of claim 12, wherein the first number of transistors is three metal-oxide semiconductor field-effect transistors.

14. The integrated circuit of claim 12, wherein the second number of transistors includes from 2 metal-oxide semiconductor field-effect transistors to 4 metal-oxide semiconductor field-effect transistors connected in parallel to each other.

15. The integrated circuit of claim 12, wherein the first number of transistors is three metal-oxide semiconductor field-effect transistors and the second number of transistors includes from 2 metal-oxide semiconductor field-effect transistors to 4 metal-oxide semiconductor field-effect transistors.

16. The integrated circuit of claim 12, wherein the first number of transistors includes first gates, and the second number of transistors includes second gates, and the first gates are connected to the second gates.

17. A method, comprising:
providing a semiconductor structure that includes metal-oxide semiconductor field-effect transistors each having drain/source regions and a channel length;
forming an active region;
forming gates across the active region;
forming a first via in contact with a first drain/source region on a first side of a first gate;
forming a second via in contact with a second drain/source region on a second side of the first gate and a first side of a second gate;
forming a third via in contact with a third drain/source region on a second side of the second gate and a first side of a third gate;
forming a fourth via in contact with a fourth drain/source region on a second side of the third gate and a first side of a fourth gate;
depositing a first conductive track on the first via and the third via to connect the first drain/source region and the third drain/source region to a first common node; and
depositing a second conductive track on the second via and the fourth via to connect the second drain/source region and the fourth drain/source region to a second common node,
wherein the first gate is part of a first metal-oxide semiconductor field-effect transistor, the second gate is part of a second metal-oxide semiconductor field-effect transistor, and the third gate is part of a third metal-oxide semiconductor field-effect transistor with the first, second, and third metal-oxide semiconductor field-effect transistors connected in parallel to each other, and the fourth gate is part of a fourth metal oxide semiconductor field-effect transistor connected in series to a fifth metal-oxide semiconductor field-effect transistor such that the connected metal-oxide semiconductor field-effect transistors provide a longer channel length than the channel length of each of the metal-oxide semiconductor field-effect transistors.

18. The method of claim 17, wherein the fourth drain/source region at the second common node is shared between the third metal-oxide semiconductor field-effect transistor and the fourth metal-oxide semiconductor field-effect transistor that shares a fifth drain/source region with the fifth metal-oxide semiconductor field-effect transistor in series with the fourth metal-oxide semiconductor field-effect transistor.

19. The method of claim 17, wherein the first common node is configured to be connected to power.

20. The method of claim 17, wherein the third drain/source region at the first common node is shared between the second metal-oxide semiconductor field-effect transistor and the third metal-oxide semiconductor field-effect transistor that shares the fourth drain/source region with the fourth metal-oxide semiconductor field-effect transistor that is connected in series with the fifth metal-oxide semiconductor field-effect transistor.

* * * * *